(12) United States Patent
Koda et al.

(10) Patent No.: US 11,221,446 B2
(45) Date of Patent: Jan. 11, 2022

(54) LASER DEVICE ASSEMBLY

(71) Applicant: SONY CORPORATION, Tokyo (JP)

(72) Inventors: Rintaro Koda, Tokyo (JP); Shunsuke Kono, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/605,439

(22) PCT Filed: Feb. 16, 2018

(86) PCT No.: PCT/JP2018/005410
§ 371 (c)(1),
(2) Date: Oct. 15, 2019

(87) PCT Pub. No.: WO2018/207422
PCT Pub. Date: Nov. 15, 2018

(65) Prior Publication Data
US 2020/0124793 A1    Apr. 23, 2020

(30) Foreign Application Priority Data

May 8, 2017  (JP) .............................. JP2017-092273

(51) Int. Cl.
  *G02B 6/125*  (2006.01)
  *G02F 1/025*  (2006.01)
  (Continued)

(52) U.S. Cl.
  CPC ............. *G02B 6/125* (2013.01); *G02F 1/025* (2013.01); *H01S 5/026* (2013.01); *H01S 5/065* (2013.01);
  (Continued)

(58) Field of Classification Search
  CPC ........ H01S 3/083; H01S 5/0265; H01S 5/005; H01S 5/50; H01S 5/026; H01S 5/065;
  (Continued)

(56) References Cited

U.S. PATENT DOCUMENTS

| 5,313,478 A | 5/1994 | Baums et al. |
| 6,192,058 B1 * | 2/2001 | Abeles ................. G02B 6/4248 359/337.11 |

(Continued)

FOREIGN PATENT DOCUMENTS

| AU | 8802601 A | 3/2002 |
| CA | 2421657 A1 | 3/2002 |

(Continued)

OTHER PUBLICATIONS

Bowers et al., Heterogeneous Silicon Photonic Integrated Circuits, Aug. 5, 2015, Journal of Lightwave Technology, vol. 34, No. 1 (Year: 2015).*

(Continued)

*Primary Examiner* — Thomas A Hollweg
*Assistant Examiner* — Mary A El-Shammaa
(74) *Attorney, Agent, or Firm* — Chip Law Group

(57) ABSTRACT

A monolithic laser device assembly 10A in the present disclosure includes a first gain portion 20 having a first end portion 20A and a second end portion 20B, a second gain portion 30 having a third end portion 30A and a fourth end portion 30B, one or multiple ring resonators 40, a semiconductor optical amplifier 50 for amplifying a laser light emitted from the first gain portion 20, and a pulse selector 60 disposed between the first gain portion 20 and the semiconductor optical amplifier 50, in which the ring resonator 40 is optically coupled with the first gain portion 20 and with the second gain portion 30, and laser oscillation is performed on either the first gain portion 20 or the second gain portion 30.

20 Claims, 11 Drawing Sheets

(51) Int. Cl.
*H01S 5/026* (2006.01)
*H01S 5/065* (2006.01)
*H01S 5/10* (2021.01)
*H01S 5/22* (2006.01)
*H01S 5/40* (2006.01)
*H01S 5/50* (2006.01)

(52) U.S. Cl.
CPC ............... *H01S 5/10* (2013.01); *H01S 5/22* (2013.01); *H01S 5/40* (2013.01); *H01S 5/50* (2013.01)

(58) Field of Classification Search
CPC ..... H01S 5/22; H01S 5/40; H01S 5/10; H01S 5/1021; H01S 5/1028–1032; H01S 5/142; H01S 5/0615; G02F 1/025; G02B 6/125
See application file for complete search history.

(56) References Cited

U.S. PATENT DOCUMENTS

| | | | | |
|---|---|---|---|---|
| 7,149,381 | B2* | 12/2006 | Margalit | H01S 5/141 |
| | | | | 385/24 |
| 7,512,296 | B2* | 3/2009 | Kwon | G02B 6/12007 |
| | | | | 359/349 |
| 7,860,404 | B2* | 12/2010 | Matsui | H04B 10/505 |
| | | | | 398/201 |
| 9,219,347 | B2* | 12/2015 | Akiyama | B82Y 20/00 |
| 9,899,799 | B2* | 2/2018 | Kobayashi | H01S 5/1032 |
| 9,905,999 | B2* | 2/2018 | Li | H01S 3/0085 |
| 10,067,031 | B2* | 9/2018 | Vahala | G01M 11/333 |
| 10,186,838 | B2* | 1/2019 | Uemura | H01S 5/026 |
| 10,355,448 | B2* | 7/2019 | Sugiyama | H01S 5/101 |
| 10,367,333 | B2* | 7/2019 | Eggleston | H01S 5/142 |
| 10,502,900 | B2* | 12/2019 | Seyedi | H01S 5/1071 |
| 2002/0037023 | A1 | 3/2002 | Margalit et al. | |
| 2005/0168735 | A1* | 8/2005 | Boppart | G01N 21/4795 |
| | | | | 356/301 |
| 2005/0249509 | A1* | 11/2005 | Nagarajan | H01S 5/024 |
| | | | | 398/198 |
| 2008/0310470 | A1* | 12/2008 | Ooi | H01S 5/341 |
| | | | | 372/44.01 |
| 2010/0142973 | A1* | 6/2010 | Gubenko | H01S 5/1025 |
| | | | | 398/159 |
| 2013/0083815 | A1* | 4/2013 | Fang | H01S 5/0612 |
| | | | | 372/20 |
| 2014/0133512 | A1 | 5/2014 | Akiyama | |
| 2015/0260521 | A1 | 9/2015 | Osinski et al. | |
| 2015/0333479 | A1 | 11/2015 | Liang et al. | |
| 2016/0227194 | A1* | 8/2016 | Kim | H04N 5/2258 |
| 2016/0282640 | A1* | 9/2016 | Guzzon | G02F 1/0147 |
| 2016/0336718 | A1* | 11/2016 | Takabayashi | H01S 5/1096 |
| 2019/0049757 | A1* | 2/2019 | Bowers | G02F 1/313 |

FOREIGN PATENT DOCUMENTS

| | | |
|---|---|---|
| CN | 103748748 A | 4/2014 |
| CN | 104081597 A | 10/2014 |
| DE | 4117866 A1 | 12/1992 |
| EP | 515968 A2 | 12/1992 |
| EP | 1316129 A2 | 6/2003 |
| EP | 2823539 A1 | 1/2015 |
| ES | 2079729 T3 | 1/1996 |
| JP | 05-152688 A | 6/1993 |
| JP | 35-152688 A | 6/1993 |
| JP | 07-287202 A | 10/1995 |
| JP | 37-287202 A | 10/1995 |
| JP | 2002-344079 A | 11/2002 |
| JP | 2012-015266 A | 1/2012 |
| JP | 2013-042173 A | 2/2013 |
| KR | 10-2014-0130674 A | 11/2014 |
| WO | 2002/021650 A2 | 3/2002 |
| WO | 2007/029647 A1 | 3/2007 |
| WO | 2013/035182 A1 | 3/2013 |
| WO | 2013/130065 A1 | 9/2013 |

OTHER PUBLICATIONS

Bowers et al., "Widely-Tunable Ring-Resonator Semiconductor Lasers", Jul. 17, 2017, Applied Science, 2017, 7, 732. (Year: 2017).*

International Search Report and Written Opinion of PCT Application No. PCT/JP2018/005410, dated Mar. 13, 2018, 10 pages of ISRWO.

Office Action for JP Patent Application No. 2019-516895, dated Oct. 5, 2021, 02 pages of English Translation and 02 pages of Office Action.

* cited by examiner

F I G . 5
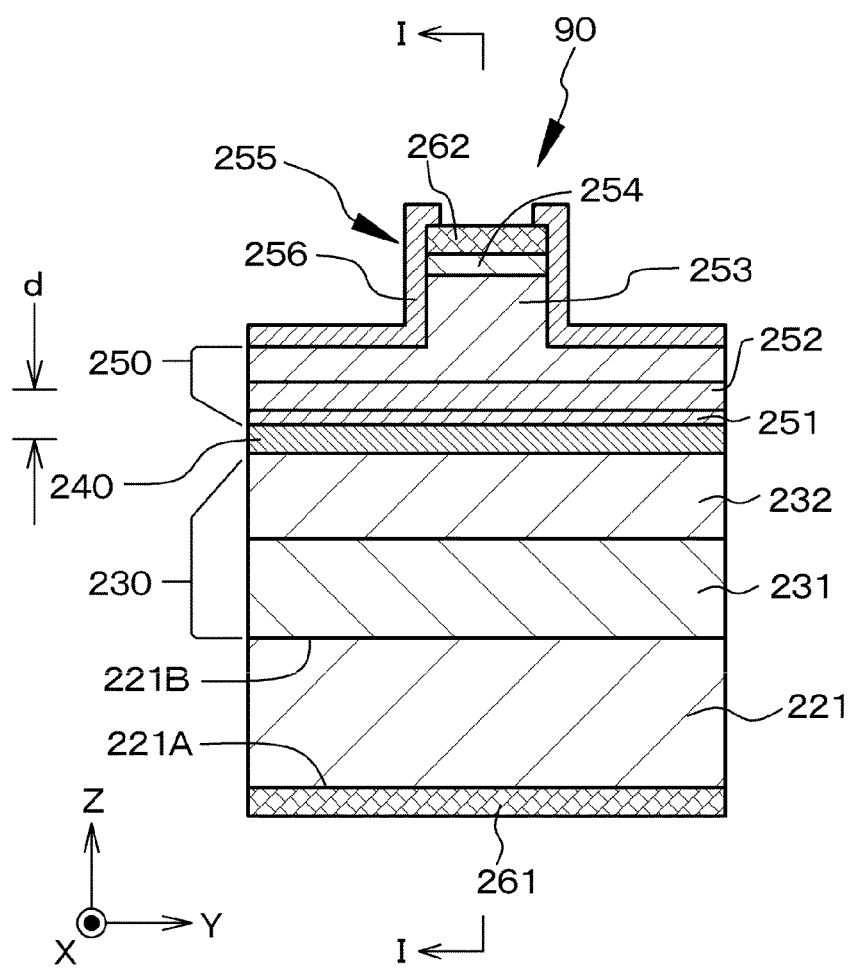

LASER DEVICE ASSEMBLY

CROSS REFERENCE TO RELATED APPLICATIONS

This application is a U.S. National Phase of International Patent Application No. PCT/JP2018/005410 filed on Feb. 16, 2018, which claims priority benefit of Japanese Patent Application No. JP 2017-092273 filed in the Japan Patent Office on May 8, 2017. Each of the above-referenced applications is hereby incorporated herein by reference in its entirety.

TECHNICAL FIELD

The present disclosure relates to a laser device assembly.

BACKGROUND ART

The technology regarding ultrashort pulse lasers has begun to advance from the latter half of the 1960s, rapidly developed and actively studied in recent years. Incidentally, as light sources for the ultrashort pulse lasers, expensive, large-sized, and high-precision solid-state laser devices represented by a titanium-sapphire laser are mainly used, and this point is one of the factors that inhibit dissemination of the technology. If an ultrashort pulse laser can be achieved using a semiconductor laser element, significant miniaturization, price reduction, and high stability will be provided, and the ultrashort pulse laser is expected to be a breakthrough for dissemination of high scientific technology in this field. For example, if an ultrashort pulse laser having a wavelength band of 405 nm can be achieved using only a semiconductor laser element, the ultrashort pulse laser can be used as a next-generation volume-type optical disk light source following Blue Ray (registered trademark), and furthermore a simple ultrashort pulse light source covering all wavelength bands in the visible light region can be achieved. For this reason, it is possible to provide light sources required in not only fields of medical care, bioimaging, photofabrication and the like but also a wide variety of fields, and the light sources are considered to remarkably contribute to progress of the scientific technology.

Incidentally, for expanding the use of the ultrashort pulse laser in a wide variety of fields, further miniaturization is required. For that purpose, development of a monolithic laser device assembly has been strongly demanded, in which the ultrashort pulse laser includes a semiconductor laser element, and a laser light emitted from the semiconductor laser element is amplified by a semiconductor optical amplifier (SOA), and furthermore a semiconductor laser element and a semiconductor optical amplifier are integrated on the same substrate.

An existing laser device assembly that is not monolithic is well known, e.g., from JP 2012-015266A. This laser device assembly includes a laser light source 100 and a semiconductor optical amplifier 200.

Incidentally, the semiconductor laser elements which have been developed so far are designed so that a repetition frequency of a laser light pulse is within a gigahertz band. This is because, an effective amplification using the semiconductor optical amplifier should be obtained because a lifetime of carriers in the semiconductor optical amplifier is of a nanosecond order. The repetition frequency of the laser light pulse in the semiconductor laser element depends on a resonator length, and therefore, when the resonator length is 15 cm, a repetition frequency of 1 gigahertz can be obtained.

Incidentally, assuming a semiconductor laser element has no external resonator, the resonator length is rate-controlled in a chip size, and as a result, the repetition frequency of the laser light pulse is several ten gigahertz to 100 gigahertz. Consequently, it becomes difficult to efficiently amplify the laser light using the semiconductor optical amplifier.

On the other hand, a ring resonator has been proposed as a method of increasing the resonator length. The effective resonator length can be made equal to or longer than the physical chip size by decreasing a ratio (branching ratio $\kappa$) of optical coupling to the ring resonator. Heretofore, variable wavelength light sources have been variously proposed, in which a plurality of ring resonators having different ring resonator lengths are used, and thereby wavelength dependencies of transmission properties of the ring resonators are utilized (e.g., see WO 2007/029647).

CITATION LIST

Patent Literature

[PTL 1]
  JP 2012-015266A
[PTL 2]
  WO 2007/029647

SUMMARY

Technical Problem

However, a monolithic laser device assembly having a resonator length appropriate for achieving a desired repetition frequency of a laser light pulse, in which a semiconductor laser element and a semiconductor optical amplifier are integrated on the same substrate, is unknown as far as the present inventors have been investigated.

Thus, an object of the present disclosure is to provide a monolithic laser device assembly having a resonator length appropriate for achieving a desired repetition frequency of a laser light pulse, in which a gain portion constituting a semiconductor laser element, and a semiconductor optical amplifier are integrated on the same substrate.

Solution to Problem

The monolithic laser device assembly according to the present disclosure for achieving the above object includes
a first gain portion having a first end portion and a second end portion,
a second gain portion having a third end portion and a fourth end portion,
one or multiple ring resonators,
a semiconductor optical amplifier for amplifying a laser light emitted from the first gain portion, and
a pulse selector disposed between the first gain portion and the semiconductor optical amplifier, in which
the ring resonator is optically coupled with the first gain portion and with the second gain portion, and
laser oscillation is performed on either the first gain portion or the second gain portion.

Advantageous Effects of Invention

Since the laser device assembly according to the present disclosure includes one or multiple ring resonators, the repetition frequency of the laser light pulse can be optimized in accordance with the semiconductor optical amplifier.

Moreover, since the pulse selector is installed, a pulse light having a desired wavelength can enter the semiconductor optical amplifier. Then, as a result of the configuration described hereinbefore, a monolithic laser device assembly achieving both high output power and miniaturization can be provided. Note that the effects described in the present specification are merely exemplary and are not limited, and additional effects may be generated.

BRIEF DESCRIPTION OF DRAWINGS

FIG. 5 is a schematic sectional view of a mode-synchronous semiconductor laser element constituting the laser device assembly in Example 1, along a direction perpendicular to an extending direction of a resonator.

DESCRIPTION OF EMBODIMENTS

Figure 1A:
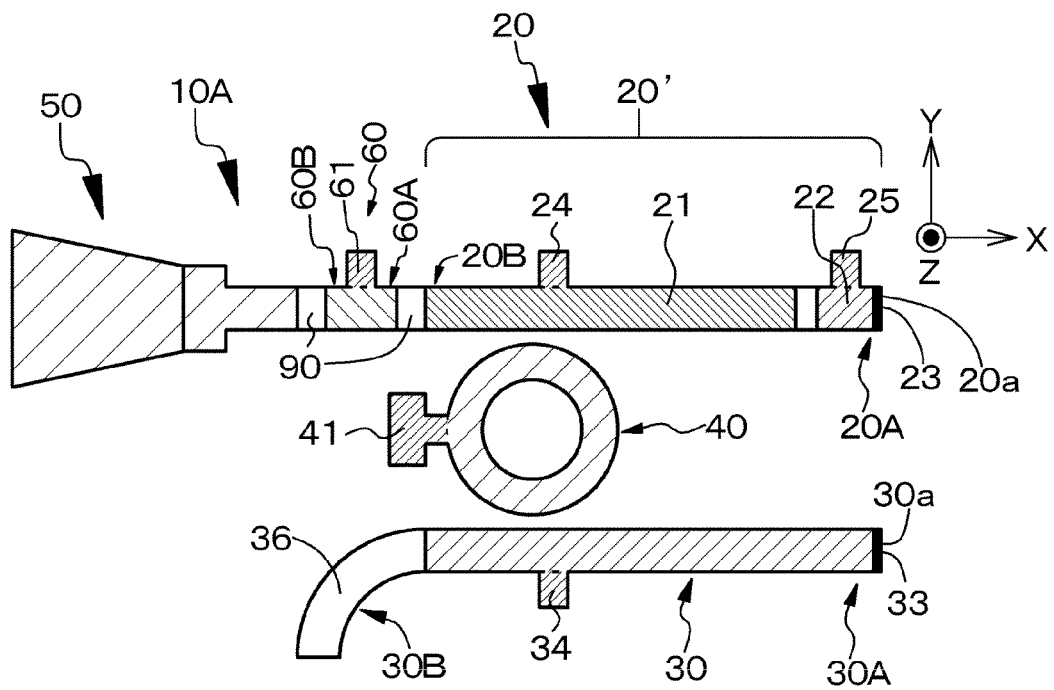
FIG. 1A and FIG. 1B depict schematic plan views of a monolithic laser device assembly in Example 1.

Hereinafter, the present disclosure will be explained on the basis of Examples with reference to the figures, but the present disclosure is not limited to Examples, and various numerical values and materials in Examples are merely exemplary. Note that the explanation will be made in the following order.

1. Explanation on the overall laser device assembly according to the present disclosure
2. Example 1 (laser device assembly according to the present disclosure, and laser device assembly of the first configuration)
3. Example 2 (variation of Example 1, and laser device assembly of the second configuration)
4. Example 3 (variation of Example 1, and laser device assembly of the third configuration)
5. Others <Explanation on the Overall Laser Device Assembly According to the Present Disclosure>

The laser device assembly according to the present disclosure can have a constitution that a first light reflection portion disposed on an end face of a first end portion of a first gain portion and a second light reflection portion disposed on an end face of a third end portion of a second gain portion constitute a resonator, and laser oscillation is performed in the resonator.

Furthermore, the laser device assembly according to the present disclosure having such a constitution can have a configuration that a first end portion of a pulse selector and a second end portion of the first gain portion are opposed to each other, and a second end portion of the pulse selector and a semiconductor optical amplifier are opposed to each other.

Incidentally, the laser device assembly having such a configuration is referred to as "laser device assembly of the first configuration" for convenience sake. Furthermore, in the constitution and configuration explained hereinbefore, a fourth end portion of the second gain portion may include a bending waveguide, and thereby generation of a return light from the fourth end portion of the second gain portion can be suppressed. Between the first end portion of the pulse selector and the second end portion of the first gain portion, there may be a laminated structure (or a part thereof) described hereinafter, or may be a space. In addition, between the second end portion of the pulse selector and the semiconductor optical amplifier, there may be a laminated structure (or a part thereof), or may be a space. There is a space between the first gain portion and a ring resonator, and there is also a space between the second gain portion and the ring resonator. In a case that a plurality of ring resonators is arranged, there are also spaces between the gain portions sandwiched by the ring resonators and the respective ring resonators.

Alternatively, the laser device assembly according to the present disclosure having such a constitution can have a configuration that an optical coupler is disposed between the second end portion of the first gain portion and the pulse selector. Incidentally, the laser device assembly having such a configuration is referred to as "laser device assembly of the second configuration" for convenience sake. The second end portion of the first gain portion is optically coupled with the optical coupler. As described hereinbefore, an amplified spontaneous emission light generated in the semiconductor optical amplifier hardly returns to the first gain portion by installing the optical coupler, and it becomes possible to further suppress the return light. In addition, such a laser device assembly of the second configuration can have a configuration that one end portion of the optical coupler is opposed to the pulse selector (specifically, the first end portion of the pulse selector), and the other end portion of the optical coupler may include the bending waveguide. Furthermore, in these preferable configurations, the second end portion of the first gain portion may include the bending waveguide, and thereby generation of the return light from the second end portion of the first gain portion can be suppressed. Furthermore, in these preferable configurations, the fourth end portion of the second gain portion may include the bending waveguide, and thereby generation of the return light from the fourth end portion of the second gain portion can be suppressed. Between one end portion of the optical coupler and the pulse selector (specifically, the first end portion of the pulse selector), there may be the laminated structure (or a part thereof) described hereinafter, or may be a space. In addition, between the second end portion of the pulse selector and the semiconductor optical amplifier, there may be the laminated structure (or a part thereof), or may be a space. There is a space between the first gain portion and the optical coupler, there is a space between the first gain portion and the ring resonator, and there is also a space between the second gain portion and the ring resonator. In a case that a plurality of ring resonators is arranged, there are also spaces between the gain portions sandwiched by the ring resonators and the respective ring resonators.

Alternatively, the laser device assembly according to the present disclosure can have a configuration that a light semi-transmission portion disposed on the second end portion of the first gain portion, and the light reflection portion disposed on the end face of the third end portion of the second gain portion constitute the resonator, and laser oscillation is performed on the resonator.

Incidentally, the laser device assembly having such a configuration is referred to as "laser device assembly of the third configuration" for convenience sake. Furthermore, in this case, it is possible to take a configuration that the light semi-transmission portion disposed on the first gain portion and the pulse selector are opposed to each other. In these configurations, the first end portion of the first gain portion may include the bending waveguide, and thereby generation of the return light from the first end portion of the first gain portion can be suppressed. Furthermore, in these configurations, the fourth end portion of the second gain portion may include the bending waveguide. Between the light semi-transmission portion and the pulse selector (specifically, the first end portion of the pulse selector), there may be the laminated structure (or a part thereof) described hereinafter, or may be a space. In addition, between the second end portion of the pulse selector and the semiconductor optical amplifier, there may be the laminated structure (or a part thereof), or may be a space. There is a space between the first gain portion and the ring resonator, and there is also a space between the second gain portion and the ring resonator. In a case that a plurality of ring resonators is arranged, there are also spaces between the gain portions sandwiched by the ring resonators and the respective ring resonators.

Furthermore, the laser device assembly of the first configuration or the second configuration including the various preferable constitutions and configurations explained hereinbefore can have a configuration that the first gain portion includes the mode-synchronous semiconductor laser element. Additionally, the laser device assembly of the third configuration including the various preferable constitutions and configurations explained hereinbefore can have a configuration that the second gain portion includes the mode-synchronous semiconductor laser element.

Furthermore, the laser device assembly according to the present disclosure including various preferable constitutions and configurations explained hereinbefore can have a configuration that the pulse selector has a structure that a positive bias (forward bias) and a reverse bias are applied, when the positive bias (forward bias) is applied to the pulse selector, the laser light emitted from the first gain portion enters the semiconductor optical amplifier, and when the reverse bias is applied to the pulse selector, the laser light emitted from the first gain portion is prevented from entering the semiconductor optical amplifier by the pulse selector.

Furthermore, in this case, the pulse selector can have a configuration that the laser light passing through the ring resonator is made to enter the semiconductor optical amplifier.

Furthermore, the laser device assembly according to the present disclosure including various preferable constitutions and configurations explained hereinbefore can have a configuration that the first gain portion, the second gain portion, the ring resonator, the semiconductor optical amplifier, and the pulse selector, as well as the optical coupler include laminated structures of compound semiconductor layers having the same structure. In this case, it is possible to take a configuration that the compound semiconductor layers include a nitride-based compound semiconductor. Furthermore, in these cases, it is possible to take a configuration that the first gain portion, the second gain portion, the ring resonator, the semiconductor optical amplifier, and the pulse selector, as well as the optical coupler are disposed on a second face of the substrate, a first electrode is formed on a first face of the substrate, and independent second electrodes are disposed on at least a part of each top face of the first gain portion, the second gain portion, the ring resonator, the semiconductor optical amplifier, and the pulse selector, as well as the optical coupler.

Furthermore, in these cases, it is possible to take a configuration that the first gain portion, the second gain portion, the ring resonator, the semiconductor optical amplifier, and the pulse selector, as well as the optical coupler have a ridge structure. Incidentally, the first gain portion, the second gain portion, the ring resonator, the semiconductor optical amplifier, and the pulse selector are collectively referred to as "semiconductor laser element and the like" in some cases. Herein, the second electrode is not necessarily disposed on the ring resonator in some cases. In the laser device assembly of the first configuration and the laser device assembly of the second configuration, the second electrode is not necessarily disposed on the second gain portion in some cases. In the laser device assembly of the third configuration, the second electrode is not necessarily disposed on the first gain portion in some cases.

Furthermore, in the laser device assembly according to the present disclosure including the various preferable configurations and constitutions explained hereinbefore, the repetition frequency of the laser light pulse in the mode-synchronous semiconductor laser element is preferably 1 GHz or lower.

In the laser device assembly according to the present disclosure including the preferable constitutions and configurations explained hereinbefore (hereinafter, collectively referred to as simply "laser device assembly and the like according to the present disclosure" in some cases), specifically the semiconductor laser element and the like can have configurations including (a) a laminated structure obtained by sequentially laminating a first compound semiconductor layer having a first-type conductivity and including a GaN-based compound semiconductor, a third compound semiconductor layer (active layer) including the GaN-based compound semiconductor, and a second compound semiconductor layer having a second-type conductivity different from the first-type conductivity and including the GaN-based compound semiconductor, (b) a second electrode formed on the second compound semiconductor layer, and (c) a first electrode electrically connected to the first compound semiconductor layer.

The first compound semiconductor layer is formed on the substrate or a base body.

The mode-synchronous semiconductor laser element can have a configuration having a ridge structure, specifically a ridge stripe type separate confinement heterostructure (SCH structure). Alternatively, the mode-synchronous semiconductor laser element can have a configuration including a slanting ridge stripe type separate confinement heterostructure. That is, an axis of the mode-synchronous semiconductor laser element and an axis of the ridge stripe structure can be constituted to intersect with each other at a predetermined angle. Herein, the predetermined angle is, e.g., 0.1 to 10 degrees. The axis of the ridge stripe structure refers to a straight line connecting a midpoint between the both ends of the ridge stripe structure at one end of the laminated structure, with a midpoint between the both ends of the ridge stripe structure at the other end opposed to the one end of the laminated structure opposite. In addition, the axis of the mode-synchronous semiconductor laser element refers to an axis perpendicular to one end and the other end of the mode-synchronous semiconductor laser element. The planar shape of the ridge stripe structure may be linear or curved.

Alternatively, under a condition that a width of the ridge stripe structure on the second end portion (fourth end portion) in the mode-synchronous semiconductor laser element is defined as $W_2$, and a width of the ridge stripe structure on the first end portion (third end portion) is defined as $W_1$, $W_1=W_2$ may be satisfied, and $W_2>W_1$ may also be satisfied. It is possible to take a configuration that $W_2$ is 5 µm or larger, and an upper limit value of $W_2$ is, but not limited to, e.g., $4\times10^2$ µm. Also, it is possible to take a configuration that $W_1$ may be 1.4 to 2.0 µm. Each edge portion of the ridge stripe structure may include one line segment or two or more line segments. In the former case, the ridge stripe structure can be constituted so that, e.g., the width is monotonously broadened in a gently tapered shape from the first end portion (third end portion) toward the second end portion (fourth end portion). On the other hand, in the latter case, e.g., the width of the ridge stripe structure is initially uniform from the first end portion (third end portion) toward the second end portion (fourth end portion), and then monotonously broadened in a gently tapered shape. Alternatively, the ridge stripe structure can be constituted so that, e.g., the width is initially broadened from the first end portion (third end portion) toward the second end portion (fourth end portion), and after exceeding the maximum width, the width is narrowed.

In a case that the second end portion of the laminated structure from which the laser light beam (pulsed laser light) is emitted includes an end face in the mode-synchronous semiconductor laser element, the optical reflectance of this end face is preferably 50% or higher. Specifically, this end face can be constituted to have a reflection coat layer. Herein, the reflection coat layer includes a laminated structure of at least two layers selected from a group consisting of, e.g., a titanium oxide layer, a tantalum oxide layer, a zirconia oxide layer, a silicon oxide layer, and an aluminum oxide layer. The value of this optical reflectance is much higher than the optical reflectance (normally 5% to 10%) of one end face of the laminated structure from which the laser light beam (pulsed laser light) is emitted in the existing semiconductor laser element.

In addition, the first light reflection portion disposed on the end face of the first end portion of the first gain portion, and the second light reflection portion disposed on the end face of the third end portion of the second gain portion, or the light reflection portion preferably have a high optical reflectance, e.g., of 85% or higher, preferably 95% or higher.

In the laser device assembly of the third configuration, the light semi-transmission portion disposed on the second end portion of the first gain portion can include a distributed bragg reflector layer (DBR layer). Specifically, a refractive index of the second end portion of the first gain portion is only required to periodically modulate (change) along the transmission direction of the laser light.

In the semiconductor laser element and the like, the laminated structure has a ridge structure including at least a part of the second compound semiconductor layer in the thickness direction. However, this ridge structure may include only the second compound semiconductor layer, or may include the second compound semiconductor layer and the third compound semiconductor layer (active layer), or may include the second compound semiconductor layer, the third compound semiconductor layer (active layer), and a part of the first compound semiconductor layer in the thickness direction. The ridge structure can be formed on the basis of, e.g., an etching method.

In the semiconductor laser element and the like, specifically the laminated structure can include an AlGaInN-based compound semiconductor. More specific examples of the AlGaInN-based compound semiconductor include GaN, AlGaN, GaInN, and AlGaInN. Furthermore, these compound semiconductors may optionally contain boron (B) atom, thallium (Tl) atom, arsenic (As) atom, phosphorus (P) atom, and antimony (Sb) atom. In addition, the third compound semiconductor layer (active layer) constituting the light emitting region (gain region)<including a saturable absorption region described hereinafter>preferably has a quantum well structure. Specifically, the third compound semiconductor layer may have a single quantum well structure [SQW structure] or a multiple quantum well structure [MQW structure]. The third compound semiconductor layer (active layer) having the quantum well structure has a structure that at least one layer of a well layer and a barrier layer is laminated, and examples of the combination (of the compound semiconductor constituting the well layer, and the compound semiconductor constituting the barrier layer) include $(In_yGa_{(1-y)}N, GaN)$, $(In_yGa_{(1-y)}N, In_zGa_{(1-x)}N)$ [in which y>z], and $(In_yGa_{(1-y)}N, AlGaN)$.

In the mode-synchronous semiconductor laser element, it is desirable that a width of the second electrode is, but not limited to, 0.5 to 50 µm, preferably 1 to 5 µm, and a height of the ridge stripe structure is, but not limited to, 0.1 to 10 µm, preferably 0.2 to 1 µm. Note that a length direction of the laminated structure is defined as an X direction, a width direction of the laminated structure is defined as a Y direction, and a thickness direction of the laminated structure is defined as a Z direction. In the semiconductor laser element and the like, the second compound semiconductor layer may have a non-doped compound semiconductor layer (e.g., non-doped GaInN layer, or non-doped AlGaN layer) between the third compound semiconductor layer and an electron barrier layer. Furthermore, a non-doped GaInN layer as a light guide layer may be formed between the third compound semiconductor layer and the non-doped compound semiconductor layer. Also it is possible to take a structure that the top layer of the second compound semiconductor layer is occupied by an Mg-doped GaN layer (p-side contact layer). The electron barrier layer, the non-doped compound semiconductor layer, the light guide layer, and the p-side contact layer constitute the second compound semiconductor layer.

In the semiconductor laser element and the like, various GaN-based compound semiconductor layers constituting the semiconductor laser element and the like are sequentially formed on the substrate or the base body. Herein, examples of the substrate or the base body include not only a sapphire substrate, but also a GaAs substrate, a GaN substrate, an SiC substrate, an alumina substrate, a ZnS substrate, a ZnO substrate, an AlN substrate, an LiMgO substrate, an $LiGaO_2$ substrate, an MgAl$_2$O$_4$ substrate, an InP substrate, an Si substrate, and substrates having a base layer or a buffer layer formed on the surfaces (main surfaces) of these substrates. Mainly in a case that the GaN-based compound semiconductor layer is formed on the substrate, the GaN substrate is preferable because of a low defect density, but it is known that the polarity of the GaN substrate varies among polar/nonpolar/semipolar states depending on a deposition face. In addition, examples of methods for forming various compound semiconductor layers (e.g., GaN-based compound semiconductor layer) constituting the semiconductor laser element and the like may include a metal organic chemical vapor deposition method (MOCVD method or MOVPE method), a molecular beam epitaxy method (MBE method), a hydride vapor-phase deposition method in which halogen contributes to transport or reaction, and the like.

Herein, examples of an organic gallium source gas in the MOCVD method may include a trimethylgallium (TMG) gas and a triethylgallium (TEG) gas, and examples of a nitrogen source gas may include ammonia gas and hydrazine gas. Additionally, in forming a GaN-based compound semiconductor layer having an n-type conductivity, e.g., silicon (Si) is only required to add as an n-type impurity (n-type dopant), and in forming a GaN-based compound semiconductor layer having a p-type conductivity, e.g., magnesium (Mg) is only required to add as a p-type impurity (p-type dopant). Additionally, in a case that aluminum (Al) or indium (In) is contained as a constituent atom of the GaN-based compound semiconductor layer, a trimethylaluminum (TMA) gas is only required to use as an Al source, and a trimethylindium (TMI) gas is only required to use as an In source. Furthermore, a monosilane gas (SiH$_4$ gas) is only required to use as an Si source, and a cyclopentadienyl magnesium gas, a methylcyclopentadienyl magnesium, or a biscyclopentadienyl magnesium (Cp$_2$Mg) is only required to use as a Mg source. Examples of the n-type impurity (n-type dopant) may include not only Si but also Ge, Se, Sn, C, Te, S, O, Pd, and Po, and examples of the p-type impurity (p-type dopant) may include not only Mg but also Zn, Cd, Be, Ca, Ba, C, Hg, and Sr.

The preferable mode-synchronous semiconductor laser element in the laser device assembly and the like according to the present disclosure is, e.g., a mode-synchronous semiconductor laser element having a saturable absorption region as described hereinbefore. Since the oscillation property can be controlled on the basis of a reverse bias voltage $V_{sa}$ for the saturable absorption region, the oscillation property can be easily controlled. Specifically, the mode-synchronous semiconductor laser element includes a bi-section type mode-synchronous semiconductor laser element in which a light emitting region and a saturable absorption region are juxtaposed along a length direction (X direction) of the laminated structure. The bi-section type mode-synchronous semiconductor laser element includes (a) a laminated structure obtained by sequentially laminating a first compound semiconductor layer having a first-type conductivity and including a GaN-based compound semiconductor, a third compound semiconductor layer (active layer) including the GaN-based compound semiconductor and constituting the light emitting region and the saturable absorption region, and a second compound semiconductor layer having a second-type conductivity different from the first-type conductivity and including the GaN-based compound semiconductor, (b) a belt-like second electrode formed on the second compound semiconductor layer, and (c) a first electrode electrically connected to the first compound semiconductor layer, and it is possible to take a configuration that the second electrode is separated into a first portion for causing a forward bias state by applying a DC current to the first electrode through the light emitting region, and a second portion for applying an electric field to the saturable absorption region, via a separation groove. Then, a DC current is applied from a first portion of the second electrode to the first electrode through the light emitting region to cause the forward bias state, and a voltage (reverse bias voltage $V_{sa}$) is applied between the first electrode and the second portion of the second electrode to apply an electric field to the saturable absorption region, so that the semiconductor laser element can be mode-synchronously operated. The first compound semiconductor layer is formed on the substrate or the base body.

The mode-synchronous semiconductor laser element can have a constitution that the length of the saturable absorption region is shorter than the length of the light emitting region, or alternatively a constitution that the length of the second electrode (total length of the first portion and the second portion) is shorter than the length of the third compound semiconductor layer (active layer). Note that the "length" refers to a length along the length direction (X direction) of the laminated structure.

Specifically, the arrangement of the first portion and the second portion of the second electrode may include (1) one first portion of the second electrode and one second portion of the second electrode are disposed, and the first portion of the second electrode and the second portion of the second electrode are arranged so as to sandwich the separation groove, (2) one first portion of the second electrode and two second portions of the second electrode are disposed, and one end of the first portion is opposed to one second portion so as to sandwich one separation groove, and the other end of the first portion is opposed to the other second portion so as to sandwich the other separation groove, (3) two first portions of the second electrode and one second portion of the second electrode are disposed, and one end of the second portion is opposed to one first portion so as to sandwich one separation groove, and the other end of the second portion is opposed to the other first portion so as to sandwich the other separation groove (i.e., the second electrode has a structure that the second portion is sandwiched by the first portions).

Widely, the arrangement may include (4) N pieces of the first portions of the second electrode and (N−1) pieces of the second portions of the second electrode are disposed, and the first portions of the second electrode are arranged so as to sandwich the second portions of the second electrode, (5) N pieces of the second portions of the second electrode and (N−1) pieces of the first portions of the second electrode are disposed, and the second portions of the second electrode are arranged so as to sandwich the first portions of the second electrode.

The states of (4) and (5) can be rephrased as (4') N pieces of light emitting regions [carrier injection region, gain region] and (N−1) pieces of saturable absorption regions [non carrier injection region] are disposed, and the light emitting regions are arranged so as to sandwich the saturable absorption regions, (5') N pieces of saturable absorption regions [non carrier injection region] and (N−1) pieces of light emitting regions

[carrier injection region, gain region] are disposed, and the saturable absorption regions are arranged so as to sandwich the light emitting regions.

Damages to the light emission end face of the mode-synchronous semiconductor laser element hardly occur by adopting the structures of (3), (5), and (5').

In the mode-synchronous semiconductor laser element, a width of the separation groove for separating the second electrode into the first portion and the second portion is 1 μm or larger, preferably 10 μm or larger, and is 50% or less, preferably 10% or less of a length of the laminated structure in a length direction (X direction) in the mode-synchronous semiconductor laser element. In addition, a distance d from the top face of the second compound semiconductor layer part located outside of the both side faces of the ridge stripe structure to the third compound semiconductor layer (active layer) is preferably $1.0 \times 10^{-7}$ m (0.1 μm) or larger. The distance d is defined in this manner, so that the saturable absorption region can be reliably formed on both sides (Y direction) of the third compound semiconductor layer. It is sufficient that the upper limit of the distance d is determined on the basis of the increase in the threshold current, the temperature property, deterioration in the current rising rate during a long-term driving, and the like.

It is desirable that the electric resistance value between the first portion and the second portion of the second electrode is $1 \times 10$ times or more, preferably $1 \times 10^2$ times or more, more preferably $1 \times 10^3$ times or more the electric resistance value between the second electrode and the first electrode. Incidentally, such a mode-synchronous semiconductor laser element is referred to as "mode-synchronous semiconductor laser element of the first constitution" for convenience sake. Alternatively, it is desirable that the electric resistance value between the first portion and the second portion of the second electrode is $1 \times 10^2 \Omega$ or higher, preferably $1 \times 10^3 \Omega$ or higher, more preferably $1 \times 10^4 \Omega$ or higher. Incidentally, such a mode-synchronous semiconductor laser element is referred to as a "mode-synchronous semiconductor laser element of the second constitution" for convenience sake.

In such a mode-synchronous semiconductor laser element of the first constitution or the second constitution, the electric resistance value between the first portion and the second portion of the second electrode is set to 10 times or more the electric resistance value between the second electrode and the first electrode, or otherwise set to $1 \times 10^2 \Omega$ or higher, so that a leakage current can be reliably prevented from flowing from the first portion to the second portion in the second electrode. That is, since the reverse bias voltage $V_{sa}$ applied to the saturable absorption region (non carrier injection region) can be increased, mode-synchronous operation with a pulsed laser light having a shorter pulse time width can be achieved. In addition, such a high electric resistance value between the first portion and the second portion of the second electrode can be achieved only by separating the second electrode into the first portion and the second portion via the separation groove.

In addition, the mode-synchronous semiconductor laser elements of the first constitution and the second constitution can have, but are not limited to, configurations that the third compound semiconductor layer has a quantum well structure including a well layer and a barrier layer, a thickness of the well layer is 1 to 10 nm, preferably 1 to 8 nm, and an impurity doping concentration in the barrier layer is $2 \times 10^{18}$ to $1 \times 10^{20}$ cm$^{-9}$, preferably $1 \times 10^{19}$ to $1 \times 10^{20}$ cm$^{-3}$.

Incidentally, such a mode-synchronous semiconductor laser element is referred to as "mode-synchronous semiconductor laser element of the third constitution" for convenience sake in some cases. A higher injection current amount can be achieved by adopting the quantum well structure for the active layer rather than by adopting a quantum dot structure, and thereby a high output can be easily obtained.

In such a way, the thickness of the well layer constituting the third compound semiconductor layer is defined as 1 to 10 nm, and furthermore the impurity doping concentration of the barrier layer constituting the third compound semiconductor layer is defined as $2 \times 10^{18}$ to $1 \times 10^{20}$ cm$^{-3}$, i.e., the thickness of the well layer is thinned and furthermore the carriers in the third compound semiconductor layer is increased, to obtain a laser light source which can reduce an influence of piezoelectric polarization and can generate a single-peaked laser light having a short pulse time width and containing a small amount of sub-pulse components. In addition, mode-synchronous drive can be achieved at a low reverse bias voltage $V_{sa}$, and a pulse train of the laser light synchronized with external signals (electric signals and optical signals) can be generated. It is possible to take a constitution that the impurity doped into the barrier layer may be, but is not limited to, silicon (Si), and may also be oxygen (O).

As described hereinbefore, the mode-synchronous semiconductor laser element preferably have a constitution that the reverse bias voltage $V_{sa}$ is applied between the first electrode and the second portion (i.e., a constitution that the first electrode is a positive electrode, and the second portion is a negative electrode). Incidentally, to the second portion of the second electrode, a pulse current or pulse voltage synchronized with a pulse current or pulse voltage to be applied to the first portion of the second electrode may be applied, or a DC bias may be applied. Additionally, it is possible to take a configuration that a current may be applied from the second electrode to the first electrode through the light emitting region, and external electric signals may be superimposed from the second electrode to the first electrode through the light emitting region. Thereby, it is possible to synchronize between the laser light and the external electric signals.

Alternatively, it is possible to take a configuration that the optical signals are incident from one end face of the laminated structure. Thereby, it is also possible to synchronize between the laser light and the optical signals.

The mode-synchronous semiconductor laser element is not limited to a bi-section type (two electrode type) mode-synchronous semiconductor laser element. Also, it is possible to adopt a multi-section type (multi electrode type) mode-synchronous semiconductor laser element, a SAL (Saturable Absorber Layer) type mode-synchronous semiconductor laser element in which the light emitting region and the saturable absorption region are arranged in the vertical direction, or a WI (Weakly Index guide) type mode-synchronous semiconductor laser element in which the saturable absorption region is placed along the ridge stripe structure.

In the semiconductor laser element and the like, the second electrode can include, e.g., a palladium layer/platinum layer laminated structure in which a palladium (Pd) single layer, a nickel (Ni) single layer, a platinum (Pt) single layer, an indium tin oxide (ITO) single layer, or a palladium layer is in contact with the second compound semiconductor layer, or of a palladium layer/nickel layer laminated structure in which a palladium layer is in contact with the second compound semiconductor layer. Incidentally, in a case that the lower metal layer includes palladium and the upper metal layer includes nickel, it is desirable that a thickness of the upper metal layer is 0.1 µm or more, preferably 0.2 µm or more. Alternatively, the second electrode preferably includes a palladium (Pd) single layer, and in this case, it is desirable that the thickness is 20 nm or more, preferably 50 nm or more. Alternatively, the second electrode preferably includes a laminated structure of a lower metal layer and an upper metal layer in which the palladium (Pd) single layer, the nickel (Ni) single layer, the platinum (Pt) single layer, or the lower metal layer is in contact with the second compound semiconductor layer (with the proviso that the lower metal layer includes one metal selected from a group consisting of palladium, nickel, and platinum, and the upper metal layer includes a metal in which an etching rate in forming the separation groove on the second electrode is equal to, or nearly equal to, or higher than an etching rate of the lower metal layer). The bending waveguide is not equipped with the second electrode.

When the first-type conductivity is of n-type, the first electrode electrically connected to the first compound semiconductor layer having n-type conductivity preferably has a single-layered constitution or a multi-layered constitution containing at least one metal selected from a group consisting of gold (Au), silver (Ag), palladium (Pd), Al (aluminum), Ti (titanium), tungsten (W), Cu (copper), Zn (zinc), tin (Sn), and indium (In), e.g., Ti/Au, Ti/Al, Ti/Pt/Au. The first electrode is electrically connected to the first compound semiconductor layer, and this configuration includes a configuration that the first electrode is formed on the first compound semiconductor layer, and a configuration that the first electrode is connected to the first compound semiconductor layer through a conductive material layer or a conductive substrate or base body. The first electrode and the second electrode can be formed into films by, e.g., a PVD method such as a vacuum evaporation method or a sputtering method.

A pad electrode may be disposed on the first electrode or the second electrode so as to be electrically connected to an external electrode or circuit. The pad electrode preferably has a single-layered constitution or a multi-layered constitution containing at least one metal selected from a group consisting of Ti (titanium), Al (aluminum), Pt (platinum), Au (gold), and Ni (nickel). Alternatively, the pad electrode can have a multi-layered constitution exemplified by a Ti/Pt/Au multi-layered constitution or a Ti/Au multi-layered constitution.

The laser device assembly and the like according to the present disclosure include a semiconductor optical amplifier (SOA), as described hereinbefore. The semiconductor optical amplifier preferably includes a laminated structure of a Group III-V nitride-based semiconductor layer, or a laminated structure of a wide gap semiconductor layer, which amplifies the laser light emitted from the first gain portion to the outside of the system. The laser light emitted from the first gain portion is emitted to the outside of the system through the semiconductor optical amplifier. In the semiconductor optical amplifier, specifically the laminated structure can include an AlGaInN-based compound semiconductor, as described hereinbefore. The constitution and structure of the semiconductor optical amplifier can be substantially similar to the constitution and structure of the mode-synchronous semiconductor laser element except that the second electrode is not separated, or alternatively, can be similar to the constitution and structure of the mode-synchronous semiconductor laser element having the separated second electrode.

It is desirable that a light confinement coefficient of the semiconductor optical amplifier is 3% or lower, preferably 1% or lower. For this purpose, the semiconductor optical amplifier preferably has a configuration that the first compound semiconductor layer has a laminated structure of a first clad layer and a first light guide layer from the base body side, the laminated structure has a ridge stripe structure including the second compound semiconductor layer, the third compound semiconductor layer (active layer), and a part of the first light guide layer in the thickness direction, and under a condition that a thickness of the first light guide layer is defined as $t_1$, and a thickness of the first light guide layer part constituting the ridge stripe structure is defined as $t_1'$, $$6 \times 10^{-7} \text{ m} < t_1,$$

preferably $$8 \times 10^{-7} \text{ m} \le t_1$$

is satisfied, and $$0 \text{ (m)} < t_1' < 0.5 \cdot t_1,$$

preferably $$0 \text{ (m)} < t_1' \le 0.3 \cdot t_1$$

is satisfied.

Incidentally, the semiconductor optical amplifier having such a configuration is referred to as "semiconductor optical amplifier of the first constitution" for convenience sake. Thus, as a result of defining the thickness $t_1$ of the first light guide layer, the light confinement coefficient can be lowered. Additionally, as a result that a peak of an optical field intensity distribution shifts from the third compound semiconductor layer (active layer) to the first light guide layer, the optical density in the vicinity of the third compound semiconductor layer can be reduced during a high output operation to prevent optical damages, and furthermore a saturated energy of the amplified laser light can increase in the semiconductor optical amplifier to achieve high output power. Moreover, as a result of defining the thickness $t_1'$ of the first light guide layer part constituting the ridge stripe structure, the mode of the output light beam can be unified. In addition, as a result that a width of the slab waveguide and a thickness of the first light guide layer are nearly the same, an approximately perfect circle cross-sectional shape of the light beam can be obtained, and harmful effects such as deterioration of the light condensing property are not caused in applications using a lens and an optical fiber. Alternatively, under a condition that a width of the ridge stripe structure (e.g., width of the ridge stripe structure on the end portion of the light emission side of the semiconductor optical amplifier) is defined as W, preferably a relationship:

$$0.2 \times W < t_1 < 1.2 \times W,$$

preferably $$0.2 \times W < t_1 \le W$$

is satisfied.

Furthermore, it is preferable to satisfy $$t_1 \le 3 \times 10^{-6} \text{ m}.$$

When crystal growth is performed so that the thickness $t_1$ of a first guide layer is $3 \times 10^{-6}$ m or less, the property and electric property of the laser light output from the semiconductor optical amplifier can be prevented from deteriorating without roughness of a crystal growth surface morphology.

Additionally, the semiconductor optical amplifier of the first constitution can have a configuration that the semiconductor optical amplifier outputs a single mode light beam. Additionally, in this case, under a condition that a width direction size of the ridge stripe structure of the light beam output from the end portion on the light emission side of the semiconductor optical amplifier is defined as $LB_X$ and the thickness direction size of the ridge stripe structure is defined as $LB_Y$, it is preferable to satisfy $$0.2 \leq LB_Y/LB_X \leq 1.2,$$

preferably $$0.2 \leq LB_Y/LB_X \leq 1.0.$$

Furthermore, at the end on the light emission side of the semiconductor optical amplifier, for a distance $Y_{CC}$ from the central point of the active layer on the laminated structure to the central point of the light beam output from the laminated structure along the thickness direction of the ridge stripe structure, it is desirable to satisfy $$t_1' \leq Y_{CC} \leq t_1,$$

preferably $$t_1' \leq Y_{CC} \leq 0.5 \cdot t_1.$$

Then, the semiconductor optical amplifier of the first constitution can have a configuration that a high refractive index layer including a compound semiconductor material having a refractive index higher than that of the compound semiconductor material constituting the first light guide layer is formed in the first light guide layer.

Specifically, in such a constitution in the semiconductor optical amplifier of the first constitution, it is possible to take a configuration that, under a condition that a refractive index of the compound semiconductor material constituting the first light guide layer is defined as $n_{G-1}$, and a refractive index of the compound semiconductor material constituting the high refractive index layer is defined as $n_{HR}$, $$0.01 \leq n_{HR} - n_{G-1} \leq 0.1,$$

preferably $$0.03 \leq n_{HR} - n_{G-1} \leq 0.1$$

is satisfied.

Incidentally, under a condition that an average refractive index of the compound semiconductor material constituting the third compound semiconductor layer (active layer) is defined as $n_{Ac}$, it is preferable to satisfy $$n_{HR} \leq n_{AC}.$$

Furthermore, the second compound semiconductor layer has a laminated structure of a second light guide layer and a second clad layer from the base body side, and can have a configuration that a thickness of the first light guide layer is larger than a thickness of the second light guide layer.

Alternatively, as described hereinbefore, it is preferable that the light confinement coefficient is 3% or lower, preferably 1% or lower. For that purpose, the semiconductor optical amplifier can have a configuration that the laminated structure has the ridge stripe structure including at least a part of the second compound semiconductor layer in the thickness direction, the first compound semiconductor layer has a thickness of more than 0.6 μm (the upper limit value of the thickness can be, e.g., 10 μm), the high refractive index layer including a compound semiconductor material having a refractive index higher than that of the compound semiconductor material constituting the first compound semiconductor layer is formed in the first compound semiconductor layer. Incidentally, the semiconductor optical amplifier having such a configuration is referred to as "semiconductor optical amplifier of the second constitution" for convenience sake.

As described hereinbefore, since the first compound semiconductor layer has a thickness of more than 0.6 μm in the semiconductor optical amplifier of the second constitution, the light confinement coefficient can be lowered. In addition, the peak of the optical field intensity distribution shifts from the third compound semiconductor layer (active layer) to the first compound semiconductor layer, and as a result, the optical density in the vicinity of the third compound semiconductor layer can be reduced during high output operation not only to prevent optical damages, but also to increase a saturation energy of the amplified laser light in the semiconductor optical amplifier, achieving a high output power. Furthermore, since the high refractive index layer including a compound semiconductor material having a refractive index higher than that of the compound semiconductor material constituting the first compound semiconductor layer is formed in the first compound semiconductor layer, the condition for the single mode of the compound semiconductor layer in the thickness direction can be satisfied in a wide range compared to the case without the high refractive index layer, and a cutoff condition can be eased to allow output of a single mode light beam.

Furthermore, the semiconductor optical amplifier of the second constitution can have a configuration that the first compound semiconductor layer has the laminated structure of the first clad layer and the first light guide layer from the base body side, the first light guide layer has a thickness of more than 0.6 μm, the high refractive index layer is formed in the first light guide layer.

That is, in such a configuration, the first light guide layer has a constitution that the first portion of the first light guide layer, the high refractive index layer, and the second portion of the first light guide layer are laminated from the base body side. Herein, the first portion of the first light guide layer is referred to as "first-A light guide layer," and the second portion of the first light guide layer is referred to as "first-B light guide layer" for convenience sake.

Additionally, in this case, a distance (i.e., thickness of the first-B light guide layer) from an interface between the third compound semiconductor layer (active layer) and the first light guide layer (interface between the third compound semiconductor layer and the first-B light guide layer) to the interface between the first light guide layer portion (first-B light guide layer) located on the third compound semiconductor layer side and the high refractive index layer is preferably 0.25 μm or more. Incidentally, an upper limit value of a value obtained by subtracting the thickness of the high refractive index layer from the thickness of the first light guide layer is, e.g., 5 μm.

Furthermore, under a condition that a refractive index of the compound semiconductor material constituting the first light guide layer is defined as $n_{G-1}$ and a refractive index of the compound semiconductor material constituting the high refractive index layer is defined as $n_{HR}$, it is possible to take a configuration satisfying $$0 < n_{HR} - n_{G-1} \le 0.3,$$

preferably $$0.02 \le n_{HR} - n_{G-1} \le 0.2.$$

Incidentally, under a condition that an average refractive index of the compound semiconductor material constituting the third compound semiconductor layer (active layer) is defined as $n_{Ac}$, it is preferable to satisfy $$n_{HR} \le n_{AC}.$$

Furthermore, the semiconductor optical amplifier of the second constitution can have a configuration that the semiconductor optical amplifier outputs a single mode light beam. Additionally, in this case, under a condition that a width direction size of the ridge stripe structure of the light beam output from the end portion on the light emission side of the semiconductor optical amplifier is defined as $LB_X$, and a thickness direction size of the ridge stripe structure is defined as $LB_Y$, it is preferable to satisfy $$3 \times 10^0 \le LB_Y/LB_X \le 1 \times 10^3,$$

preferably $$1 \times 10^1 \le LB_Y/LB_X \le 1 \times 10^2.$$

Furthermore, at the end portion on the light emission side of the semiconductor optical amplifier, for the distance $Y_{CC}$ from the central point of the active layer on the laminated structure to the central point of the light beam output from the laminated structure along the thickness direction of the ridge stripe structure, it is preferable to satisfy $$0 \text{ m} < Y_{CC} \le (\text{thickness of the first light guide layer}),$$

preferably, $$0 \text{ m} < Y_{CC} \le (\text{thickness of the first-}B \text{ light guide layer}).$$

Furthermore, the second compound semiconductor layer has the laminated structure of the second light guide layer and the second clad layer from the base body side, and can have a configuration that the thickness of the first light guide layer is larger than the thickness of the second light guide layer.

The laser device assembly according to the present disclosure can be applied to fields, e.g., optical disc systems, communication fields, optical information fields, optoelectronic integrated circuits, nonlinear optical phenomena application fields, optical switches, laser measurement fields and various analysis fields, ultrafast spectroscopy fields, multiphoton excitation spectroscopy fields, mass spectrometry fields, microspectroscopy fields using multiphoton absorption, quantum control for chemical reaction, nano three-dimensional processing fields, various processing fields applying multiphoton absorption, medical fields, bio-imaging fields, quantum information communication fields, and quantum information processing fields.

Example 1

Figure 1B:
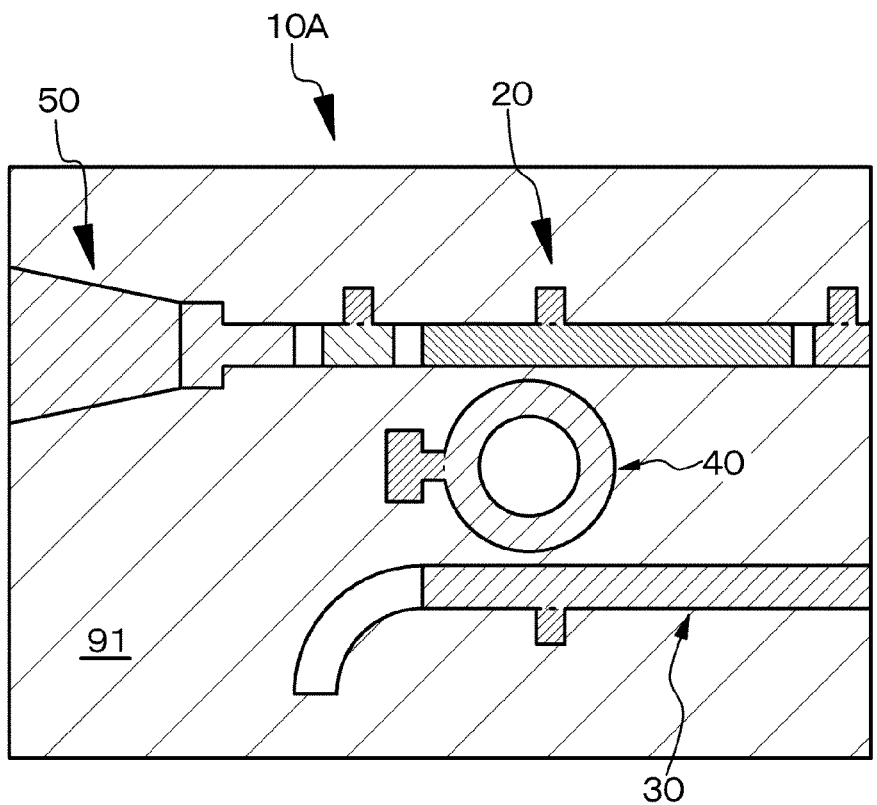
Figure 6:
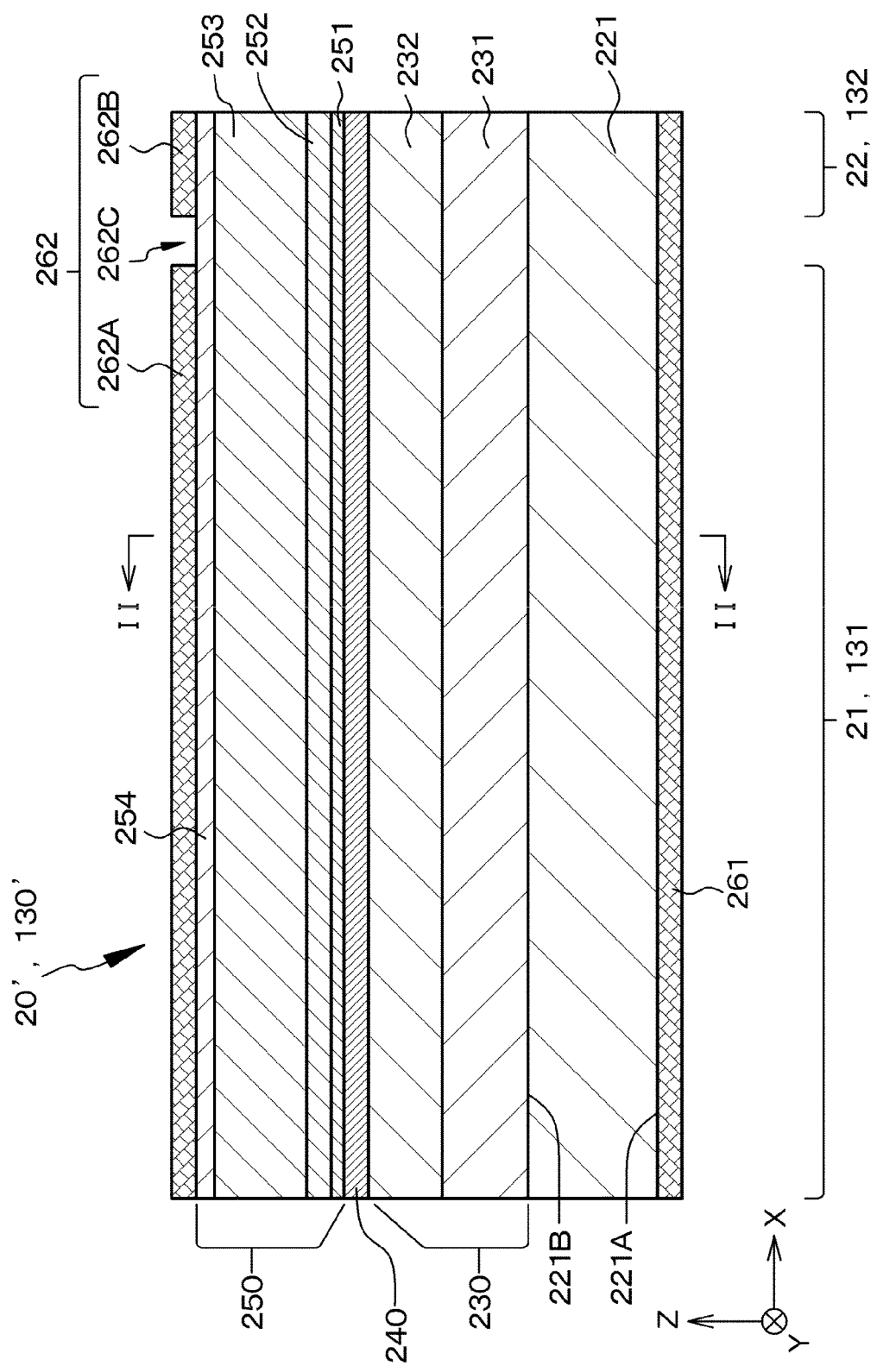
FIG. 6 is a schematic end view of the mode-synchronous semiconductor laser element constituting the laser device assembly in Example 1, along the extending direction of the resonator.
Figure 7A:
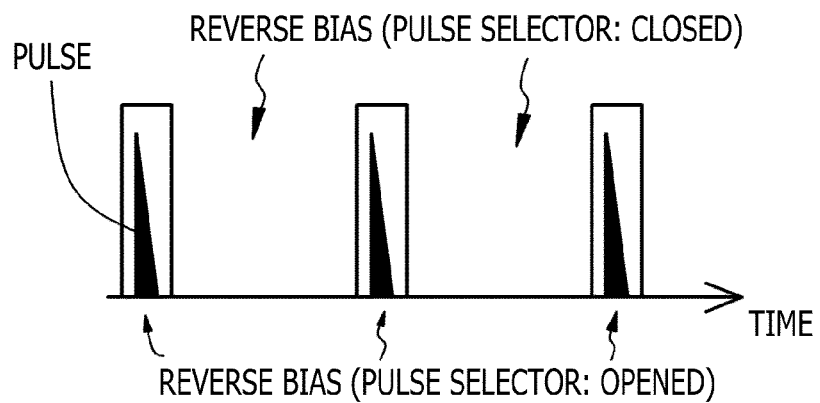
FIG. 7A and FIG. 7B depict drawings schematically illustrating an operation timing of a pulse selector.
Figure 7B:
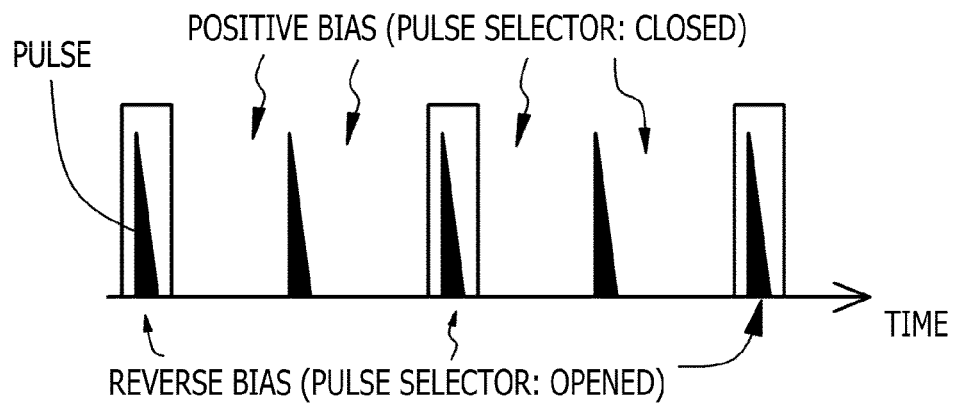

Example 1 relates to the laser device assembly according to the present disclosure, specifically to the laser device assembly of the first configuration. FIG. 1A and FIG. 1B depict schematic plan views of a monolithic laser device assembly in Example 1. In addition, FIG. 5 depicts a schematic sectional view of a mode-synchronous semiconductor laser element constituting the laser device assembly in Example 1, along a direction perpendicular to an extending direction of a resonator. FIG. 6 depicts a schematic end view of the mode-synchronous semiconductor laser element, along the extending direction of the resonator. FIG. 7A and FIG. 7B depict drawings schematically illustrating operation timings of the pulse selector. Herein, FIG. 1A is a drawing clearly indicating elements constituting a monolithic laser device assembly 10A in Example 1, and FIG. 1B is a general view of a monolithic laser device assembly 10B in Example 1.

Incidentally, in a case of using the mode-synchronous semiconductor laser element and the ring resonator in combination, under a condition that a circumference length of the ring resonator is defined as $l_r$ and a branching ratio of the ring resonator and the mode-synchronous semiconductor laser element (specifically, a part of a linear waveguide of the mode-synchronous semiconductor laser element) is defined as $\kappa$, the effective resonator length $l_{reff}$ of the ring resonator can be represented by $$l_{reff} = \{(1-\kappa^2)/\kappa^2\}l_r.$$

Figure 8:
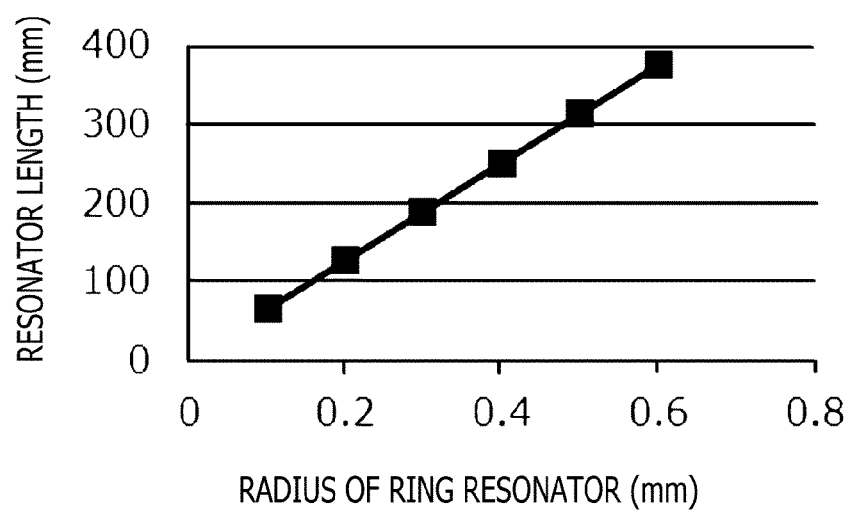
FIG. 8 is a graph depicting a relationship between a resonator length and a radius of a ring resonator.

For this reason, in a case of approximately $\kappa = 0.1$, the resonator length can be considerably longer than a physical length of the ring resonator. The graph of FIG. 8 depicts a relationship between the resonator length (unit: mm) and a radius of the ring resonator (unit: mm), in the case of $\kappa = 0.1$, under a condition that a length of the linear waveguide part of the mode-synchronous semiconductor laser element is set to 1.0 mm. The branching ratio $\kappa$ can be set to a desired value on the basis of, e.g., a coupled mode theory. In addition, as a result that the optical length of the ring resonator can be changed by controlling the refractive index of the entire ring resonator, the resonator length of the ring resonator can be set to a desired length. For example, the refractive index of the entire ring resonator can be controlled by using the material constituting the second electrode formed on the top face of the ring resonator as a transparent conductive material such as ITO.

The monolithic laser device assembly 10A in Example 1 includes a first gain portion 20 having a first end portion 20A and a second end portion 20B, a second gain portion 30 having a third end portion 30A and a fourth end portion 30B, one or multiple (one, in Example 1) ring resonators 40, a semiconductor optical amplifier 50 for amplifying a laser light emitted from the first gain portion 20, and a pulse selector 60 disposed between the first gain portion 20 and the semiconductor optical amplifier 50, in which the ring resonator 40 is optically coupled with the first gain portion 20 and with the second gain portion 30, and laser oscillation is performed on either the first gain portion 20 or the second gain portion 30.

Furthermore, in the laser device assembly in Example 1, a first light reflection portion (specifically, first light reflection face) 23 disposed on an end face 20a of the first end portion 20A of the first gain portion 20, and a second light reflection portion (specifically, second light reflection face) 33 disposed on an end face 30a of the third end portion 30A of the second gain portion 30 constitute a resonator. More specifically, the first light reflection portion 23 and the second light reflection portion 33 include light reflection faces including a high reflection coat layer (HR). In addition, laser oscillation is performed in this resonator.

In addition, a first end portion 60A of the pulse selector 60 and the second end portion 20B of the first gain portion 20 are opposed to each other, and a second end portion 60B of the pulse selector 60 and the semiconductor optical amplifier 50 are opposed to each other. The fourth end portion 30B of the second gain portion 30 includes a bending waveguide 36, which prevents generation of a return light from the fourth end portion 30B of the second gain portion 30. Between the first end portion 60A of the pulse selector 60 and the second end portion 20B of the first gain portion 20, a laminated structure 90 is left. Also, between the second end portion 60B of the pulse selector 60 and the semiconductor optical amplifier 50, the laminated structure 90 is left. There is a space between the first gain portion 20 and the ring resonator 40, and there is also a space between the second gain portion 30 and the ring resonator 40. Reference number 91 refers to a region of the laminated structure other than the ridge structure, and this region includes at least a part of the second compound semiconductor layer in the thickness direction. In other words, this region may include a part of the first compound semiconductor layer in the thickness direction, or may include the third compound semiconductor layer (active layer) and the first compound semiconductor layer, or may include a part of the second compound semiconductor layer in the thickness direction, the third compound semiconductor layer (active layer), and the first compound semiconductor layer. The ridge structure and a region 91 of the laminated structure other than the ridge structure can be formed on the basis of, e.g., an etching method.

Incidentally, in a case that the laminated structure 90 between the first gain portion 20 and the pulse selector 60 is removed in the first gain portion 20 in Example 1, a non-reflective coat layer (AR) is formed on the end face (light emission end face) on the second end portion 20B of the first gain portion 20 opposed to the pulse selector 60.

The first gain portion 20 includes a mode-synchronous semiconductor laser element 20'. FIG. 6 depicts a schematic end view of the mode-synchronous semiconductor laser element 20', along an extending direction of the resonator (i.e., along an arrow I-I in FIG. 5). FIG. 5 depicts a schematic sectional view of the mode-synchronous semiconductor laser element 20', along a direction perpendicular to the extending direction of the resonator (i.e., along an arrow I-II in FIG. 6).

The mode-synchronous semiconductor laser element 20' has a light emitting region (gain region) 21 and a saturable absorption region 22. The saturable absorption region 22 is disposed on the side of the first end face 20a of the first gain portion 20. Specifically, the mode-synchronous semiconductor laser element 20' includes a bi-section type mode-synchronous semiconductor laser element in which the light emitting region 21 and the saturable absorption region 22 are juxtaposed in the direction of the resonator.

Alternatively, the mode-synchronous semiconductor laser element 20' has a laminated structure obtained by sequentially laminating a first compound semiconductor layer 230 including a GaN-based compound semiconductor and having a first-type conductivity (n-type conductivity in Examples), a third compound semiconductor layer (active layer) 240 including the GaN-based compound semiconductor, and a second compound semiconductor layer 250 including the GaN-based compound semiconductor and having a second-type conductivity different from the first-type conductivity (p-type conductivity in Examples).

The first compound semiconductor layer 230 is formed on the base body (specifically, substrate 221).

More specifically, as illustrated in FIG. 5 and FIG. 6, the bi-section type mode-synchronous semiconductor laser element 20' having an emission wavelength band of 405 nm includes (a) a laminated structure obtained by sequentially laminating the first compound semiconductor layer 230 having the first-type conductivity (specifically, n-type conductivity) and including the GaN-based compound semiconductor, the third compound semiconductor layer (active layer) 240 including the GaN-based compound semiconductor and constituting the light emitting region (gain region) 21 and the saturable absorption region 22, and the second compound semiconductor layer 250 having the second-type conductivity (specifically, p-type conductivity) different from the first-type conductivity and including the GaN-based compound semiconductor, (b) a belt-like second electrode 262 formed on the second compound semiconductor layer 250, and (c) a first electrode 261 electrically connected to the first compound semiconductor layer 230.

Incidentally, the mode-synchronous semiconductor laser element 20' has the ridge stripe type separate confinement heterostructure (SCH structure).

Furthermore, in Example 1, or Examples 2 and 3 described hereinafter, the mode-synchronous semiconductor laser element 20' is a passive mode-synchronous, active mode-synchronous or hybrid mode-synchronous semiconductor laser element of a current injection type, in which an optical density of a peak power is $1 \times 10^{10}$ watts/cm$^2$ or higher, preferably $1.4 \times 10^{10}$ watts/cm$^2$ or higher, and a carrier density is $1 \times 10^{19}$/cm$^3$ or higher. Thus, as a result of defining the optical density of a peak power of the laser light emitted from the mode-synchronous semiconductor laser element, and further defining the carrier density value in the mode-synchronous semiconductor laser element, a self-phase modulation is generated at a high optical power density and a high carrier density, and an appropriate group velocity dispersion value is given for the self-phase modulation to reliably generate a pulsed laser light of subpicosecond level. Moreover, in addition to narrowing of the pulse time width such as the pulsed laser light of subpicosecond level, the current injection type mode-synchronous semiconductor laser element has an advantage of a higher energy efficiency than that of the light excitation type mode-synchronous semiconductor laser element.

The second electrode 262 is separated into a first portion 262A for causing a forward bias state by applying a DC current to the first electrode 261 through the light emitting region (gain region) 21, and a second portion 262B for applying an electric field to the saturable absorption region 22 (second portion 262B for applying the reverse bias voltage $V_{sa}$ to the saturable absorption region 22), via a separation groove 262C. Herein, an electric resistance value (also referred to as "separation resistance value" in some cases) between the first portion 262A and the second portion 262B of the second electrode 262 is 1×10 times or more, specifically $1.5 \times 10^3$ times the electric resistance value between the second electrode 262 and the first electrode 261. In addition, the electric resistance value (separation resistance value) between the first portion 262A and the second portion 262B of the second electrode 262 is $1 \times 10^2 \Omega$ or higher, specifically $1.5 \times 10^4 \Omega$. The total length of the mode-synchronous semiconductor laser element 20' was set to 1.00 mm, and the lengths of the first portion 262A, the second portion 262B, and the separation groove 262C of the second electrode 262 were set to 0.96 mm, 0.03 µm, and 0.01 µm, respectively. In addition, a width of a ridge stripe structure 255 was set to 1.4 µm.

In addition, the first gain portion 20, the second gain portion 30, the ring resonator 40, the semiconductor optical amplifier 50, and the pulse selector 60 include laminated structures of the compound semiconductor layers having the same structure, and specifically the compound semiconductor layers include a nitride-based compound semiconductor.

Furthermore, the first gain portion 20, the second gain portion 30, the ring resonator 40, the semiconductor optical amplifier 50, and the pulse selector 60 are disposed on a second face 221B of the substrate 221, the first electrode 261 is formed on a first face 221A of the substrate 221, and independent second electrodes are disposed on at least a part of each top face of the first gain portion 20, the second gain portion 30, the ring resonator 40, the semiconductor optical amplifier 50, and the pulse selector 60.

Furthermore, the first gain portion 20, the second gain portion 30, the ring resonator 40, the semiconductor optical amplifier 50, and the pulse selector 60 have a ridge structure.

The mode-synchronous semiconductor laser element 20' is specifically a mode-synchronous semiconductor laser element having a ridge stripe type separate confinement heterostructure (SCH structure). More specifically, the mode-synchronous semiconductor laser element 20' is an index guide type GaN-based semiconductor laser element including AlGaInN, and has a ridge stripe structure. In addition, the first compound semiconductor layer 230, the third compound semiconductor layer (active layer) 240, and the second compound semiconductor layer 250 specifically include an AlGaInN-based compound semiconductor, and more specifically have layer constitutions depicted in the following Table 1. Herein, in Table 1, the lower the compound semiconductor layers are described, the closer the layers are to the n-type GaN substrate 221. A band gap of the compound semiconductor constituting the well layer in the third compound semiconductor layer 240 is 3.06 eV. In Example 1, or Examples 2 and 3 described hereinafter, the mode-synchronous semiconductor laser element 20' is disposed on a face (0001) of the n-type GaN substrate 221, and the third compound semiconductor layer 240 has a quantum well structure. The face (0001) of the n-type GaN substrate 221 is also referred to as "C face," and is a crystal face having a polarity.

[Table 1]
Second compound semiconductor layer 250
  p-type GaN contact layer (Mg-doped) 254
  p-type GaN (Mg-doped)/AlGaN super-lattice clad layer 253
  p-type AlGaN electron barrier layer (Mg-doped) 252
  Non-doped GaInN light guide layer 251
Third compound semiconductor layer 240
  GaInN quantum well active layer
  (Well layer: $Ga_{0.92}In_{0.08}N$/barrier layer: $Ga_{0.98}In_{0.02}N$)
First compound semiconductor layer 230
  n-type GaN clad layer 232
  n-type AlGaN clad layer 231
with the proviso that,
  Well layer (two layers) 8 nm, non-doped
  Barrier layer (three layers) 14 nm, Si-doped In addition, parts of the p-type GaN contact layer 254 and the p-type GaN/AlGaN super-lattice clad layer 253 are removed by an RIE method, where the ridge stripe structure 255 is formed. A laminated insulating film 256 including $SiO_2$/Si is formed on both sides of the ridge stripe structure 255. Incidentally, the $SiO_2$ layer is the lower layer, and the Si layer is the upper layer. Herein, a difference in effective refractive indexes between the ridge stripe structure 255 and the laminated insulating film 256 is $5\times10^{-3}$ to $1\times10^{-2}$, specifically $7\times10^{-3}$. In addition, the second electrode (p-side ohmic electrode) 262 is formed on the p-type GaN contact layer 254 corresponding to the top face of the ridge stripe structure 255. On the other hand, the first electrode (n-side ohmic electrode) 261 including Ti/Pt/Au is formed on the back side of the n-type GaN substrate 221.

In the mode-synchronous semiconductor laser element 20' in Example 1, or Examples 2 and 3 described hereinafter, the p-type AlGaN electron barrier layer 252, the p-type GaN/AlGaN super-lattice clad layer 253, and the p-type GaN contact layer 254 which are Mg-doped compound semiconductor layers are arranged in such a way that they are not overlap as much as possible, so that an internal loss is reduced to an extent that an internal quantum efficiency is not decreased in an optical density distribution generated from the third compound semiconductor layer 240 and the vicinity thereof. Thereby, the threshold current density at which the laser oscillation is started is reduced. Specifically, a distance d from the third compound semiconductor layer 240 to the p-type AlGaN electron barrier layer 252 was 0.10 µm, a height of the ridge stripe structure 255 was 0.30 µm, a thickness of the second compound semiconductor layer 250 located between the second electrode 262 and the third compound semiconductor layer 240 was 0.50 µm, and a thickness of the p-type GaN/AlGaN super-lattice clad layer 253 part located below the second electrode 262 was 0.40 µm.

In FIG. 1A and FIG. 1B, and FIG. 2A, FIG. 2B, FIG. 3, and FIG. 4 described hereinafter, the second electrodes formed on the top faces of the first gain portion 20, the second gain portion 30, the ring resonator 40, the semiconductor optical amplifier 50, and the pulse selector 60 are hatched for clarity. The second electrode 262 in the first gain portion 20 is equipped with pad portions 24 and 25 for connecting the second electrode 262 to the outside. That is, the light emitting region (gain region) 21 is equipped with the pad portion 24, and the saturable absorption region 22 is equipped with the pad portion 25. Similarly, the second electrode on the ring resonator 40 is equipped with a pad portion 41 for connecting the second electrode to the outside, the second electrode on the second gain portion 30 is equipped with a pad portion 34 for connecting the second electrode to the outside, and the second electrode on the pulse selector 60 is equipped with a pad portion 61 for connecting the second electrode to the outside. The substrate 221 is equipped with the first electrode (n-side ohmic electrode) 261 common to the first gain portion 20, the second gain portion 30, the ring resonator 40, the semiconductor optical amplifier 50, and the pulse selector 60.

Then, a part (determined depending on K) of the laser light generated in the first gain portion 20 is optically coupled with the ring resonator 40 and moves to the ring resonator 40. Then, after a certain period of a staying time in the ring resonator 40, a part (determined depending on K) of the laser light in the ring resonator 40 is optically coupled with the second gain portion 30 and moves to the second gain portion 30. Out of the laser light from which the gain was obtained in the second gain portion 30, a part of the laser light not coupled with the ring resonator 40 proceeds to the bending waveguide 36, but the gain cannot be obtained because the second electrode is not formed on this part. In addition, the bending waveguide 36 can prevent the light from returning from the bending waveguide 36 to the second gain portion 30. Contrary to the above explanation, the laser light in the second gain portion 30 is optically coupled with the ring resonator 40 and moves to the ring resonator 40. Then, after a certain period of a staying time in the ring resonator 40, a part (determined depending on K) of the laser light in the ring resonator 40 is optically coupled with the first gain portion 20 and moves to the first gain portion 20. In such a way, the laser light is generated in the resonator including the first light reflection portion 23 and the second light reflection portion 33. Then, a part of the laser light in the first gain portion 20 enters the semiconductor optical amplifier 50 through the pulse selector 60, and is optically amplified in the semiconductor optical amplifier 50, and emitted from the semiconductor optical amplifier 50.

Since the ring resonator 40 can be made to strongly depend on the wavelength, the ring length of the ring resonator 40 and the refractive index of the laminated structure are adjusted so as to perform the oscillation at a side of a shorter wave than the wave at the peak of the amplified spontaneous emission light (ASE) of the semiconductor optical amplifier 50. Furthermore, structurally the ring resonator 40 may be equipped with the second electrode so that structurally the gain can be obtained depending on the current amount of the second electrode, or the resonator 40 is operated by a transparency current and made to function as a passive waveguide. Herein, the phrase "operated by a transparency current" means that the ring resonator 40 is equipped with the second electrode, and the current amount flowing in the ring resonator 40 is adjusted to operate the ring resonator 40 in a state that the gain is not obtained in the ring resonator 40.

In the laser device assembly in Example 1, the pulse selector 60 can be driven independently from the mode-synchronous semiconductor laser element 20' by disposing the second electrode on the pulse selector 60.

Furthermore, the pulse selector 60 has a structure that a positive bias (forward bias) and a reverse bias are applied (i.e., has the first electrode and the second electrode), when a positive bias (forward bias) is applied to the pulse selector 60, the pulse selector 60 becomes a certain opened state, and the laser light emitted from the first gain portion 20 enters the semiconductor optical amplifier 50, and when a reverse bias is applied to the pulse selector 60, the pulse selector 60 becomes a certain closed state, and the laser light emitted from the first gain portion 20 is prevented from entering the semiconductor optical amplifier 50 by the pulse selector 60.

The pulse selector 60 allows the laser light from the ring resonator 40 to enter the semiconductor optical amplifier 50. In a case that the pulse selector 60 is passive-mode-synchronously driven, a timing for shifting the pulse selector 60 to the opened state/closed state can be optimized by monitoring the current flowing through the saturable absorption region 22 of the mode-synchronous semiconductor laser element 20'.

In addition, the pulse selector 60 also has a function of filtering the amplified spontaneous emission light from the semiconductor optical amplifier 50 and the amplified spontaneous emission light from the mode-synchronous semiconductor laser element 20', and thereby the return light to the mode-synchronous semiconductor laser element 20' and the amplified spontaneous emission light from the mode-synchronous semiconductor laser element 20' can be prevented from amplifying by the semiconductor optical amplifier 50.

Herein, noise lights can be suppressed by driving the pulse selector 60 as depicted in FIG. 7A. In addition, the laser light pulse can be thinned out as depicted in FIG. 7B by increasing the time for applying the reverse bias to the pulse selector 60. Depending on the application fields of the laser device assembly, abnormalities or the like due to heat generation may be caused using all laser light pulses, but the substantial repetition frequency of the laser light pulse can be decreased than the fundamental frequency by thinning out the laser light pulse. Incidentally, the repetition frequency of the laser light pulse is preferably 1 GHz or lower.

Since the laser device assembly in Example 1 includes one or multiple ring resonators, the repetition frequency of the laser light pulse can be optimized in accordance with the semiconductor optical amplifier. Furthermore, since the laser device assembly includes the pulse selector, a pulse light having a desired wavelength can enter the semiconductor optical amplifier. As a result, a laser light pulse light source having a high peak power can be miniaturized, and a monolithic laser device assembly achieving both high output power and miniaturization can be provided. In addition, a laser light pulse light source without increase in noises and the like resulting from the return light can be provided, and the repetition frequency of the laser light pulse can be controlled to a desired value.

Example 2

Figure 2A:
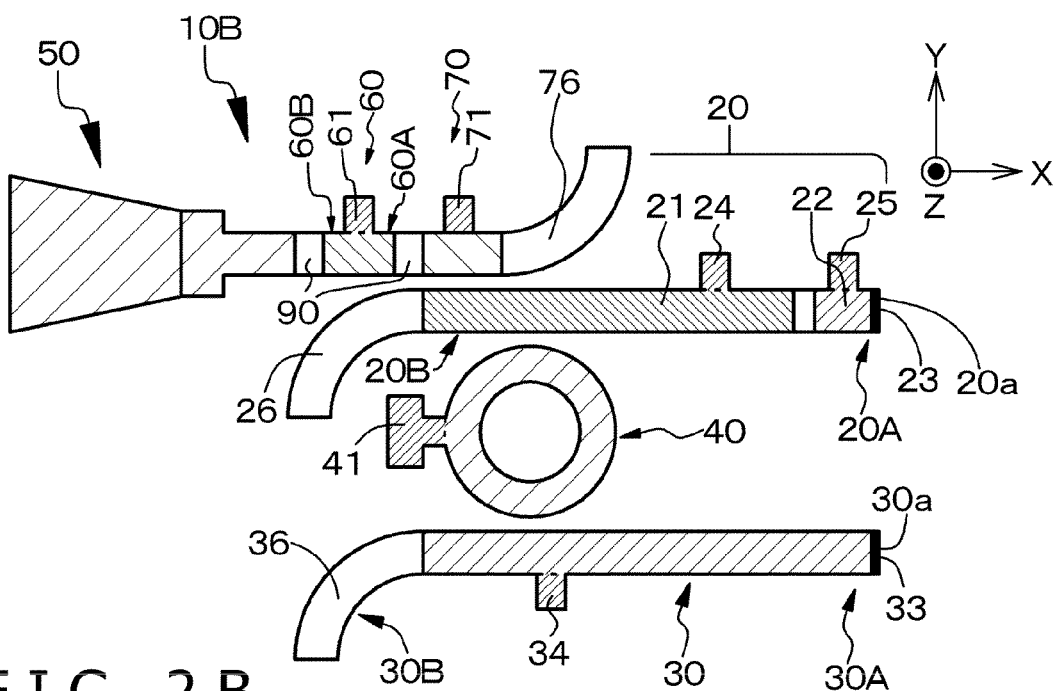
FIG. 2A and FIG. 2B depict schematic plan views of a monolithic laser device assembly in Example 2.
Figure 2B:
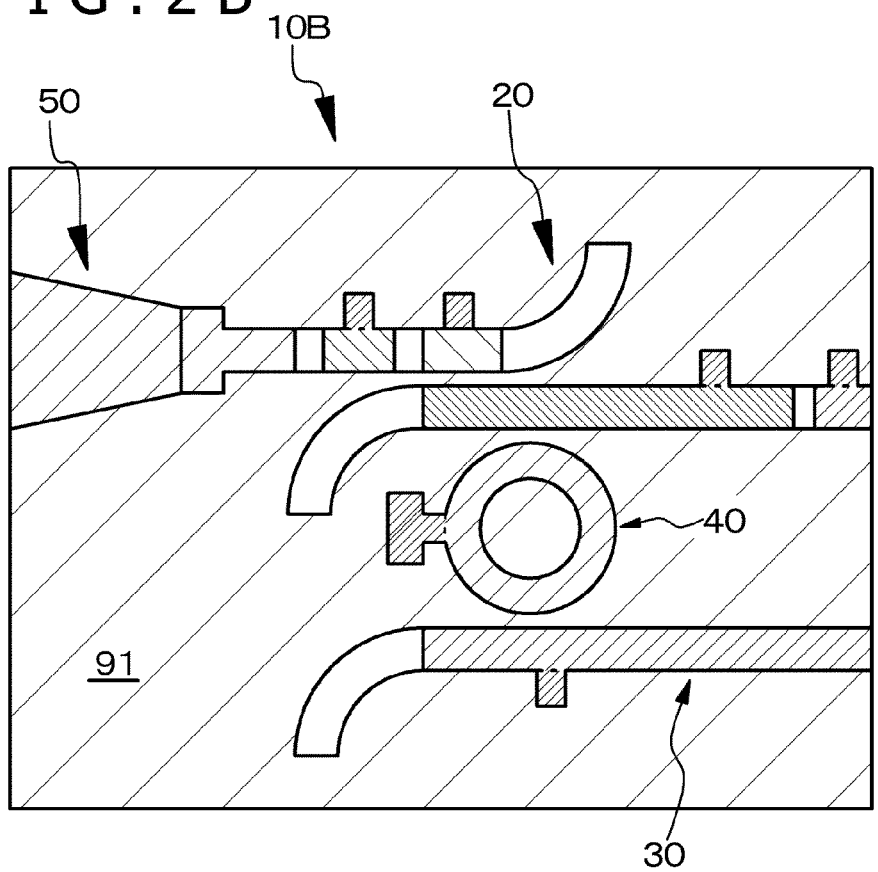

Example 2 is a variation of Example 1, and relates to the laser device assembly of the second configuration. FIG. 2A and FIG. 2B depict schematic plan views of the monolithic laser device assembly 10B in Example 2. Herein, FIG. 2A is a drawing clearly indicating elements constituting the monolithic laser device assembly 10B in Example 2, and FIG. 2B is a general view of the monolithic laser device assembly 10B in Example 2.

In the laser device assembly in Example 2, an optical coupler 70 is disposed between the second end portion 20B of the first gain portion 20 and the pulse selector 60. The second end portion 20B of the first gain portion 20 is optically coupled with the optical coupler 70. One end portion of the optical coupler 70 is opposed to the pulse selector 60 (specifically, the first end portion 60A of the pulse selector 60), and the other end portion of the optical coupler 70 includes a bending waveguide 76. Furthermore, the end of the second end portion 20B of the first gain portion 20 includes a bending waveguide 26, and thereby generation of a return light from the second end portion 20B of the first gain portion 20 can be suppressed. The fourth end portion 30B of the second gain portion 30 includes the bending waveguide 36.

Between one end portion of optical coupler 70 and the pulse selector 60 (specifically, the first end portion 60A of the pulse selector 60), the laminated structure 90 is left. Also, between the second end portion 60B of the pulse selector 60 and the semiconductor optical amplifier 50, the laminated structure 90 is left. There is a space between the first gain portion 20 and the optical coupler 70, there is also a space between the first gain portion 20 and the ring resonator 40, and there is also a space between the second gain portion 30 and the ring resonator 40.

The optical coupler 70 includes a laminated structure of a compound semiconductor layer having the same structure as the laminated structure constituting the mode-synchronous semiconductor laser element 20'. The optical coupler 70 is disposed on the second face 221B of the substrate 221. On the top face of the optical coupler 70, independent second electrodes are disposed, and a pad portion 71 for connecting the second electrodes to the outside is disposed. Thus, the disposition of the optical coupler 70 prevents the amplified spontaneous emission light generated in the semiconductor optical amplifier 50 from returning to the mode-synchronous semiconductor laser element 20', and further return lights can be suppressed.

Example 3

Example 3 is a variation of Example 1, and relates to the laser device assembly of the third configuration.

Figure 3:
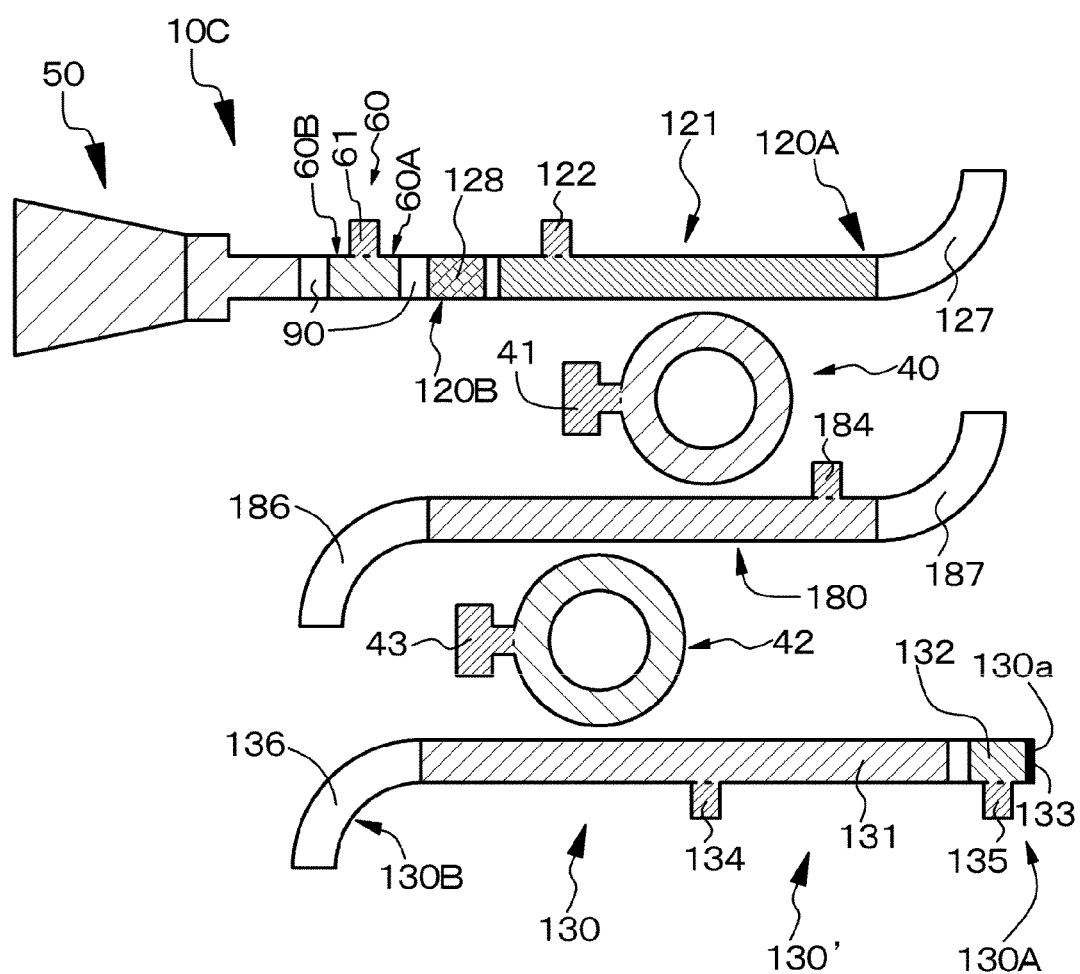
FIG. 3 is a schematic plan view of a monolithic laser device assembly in Example 3.
Figure 4:
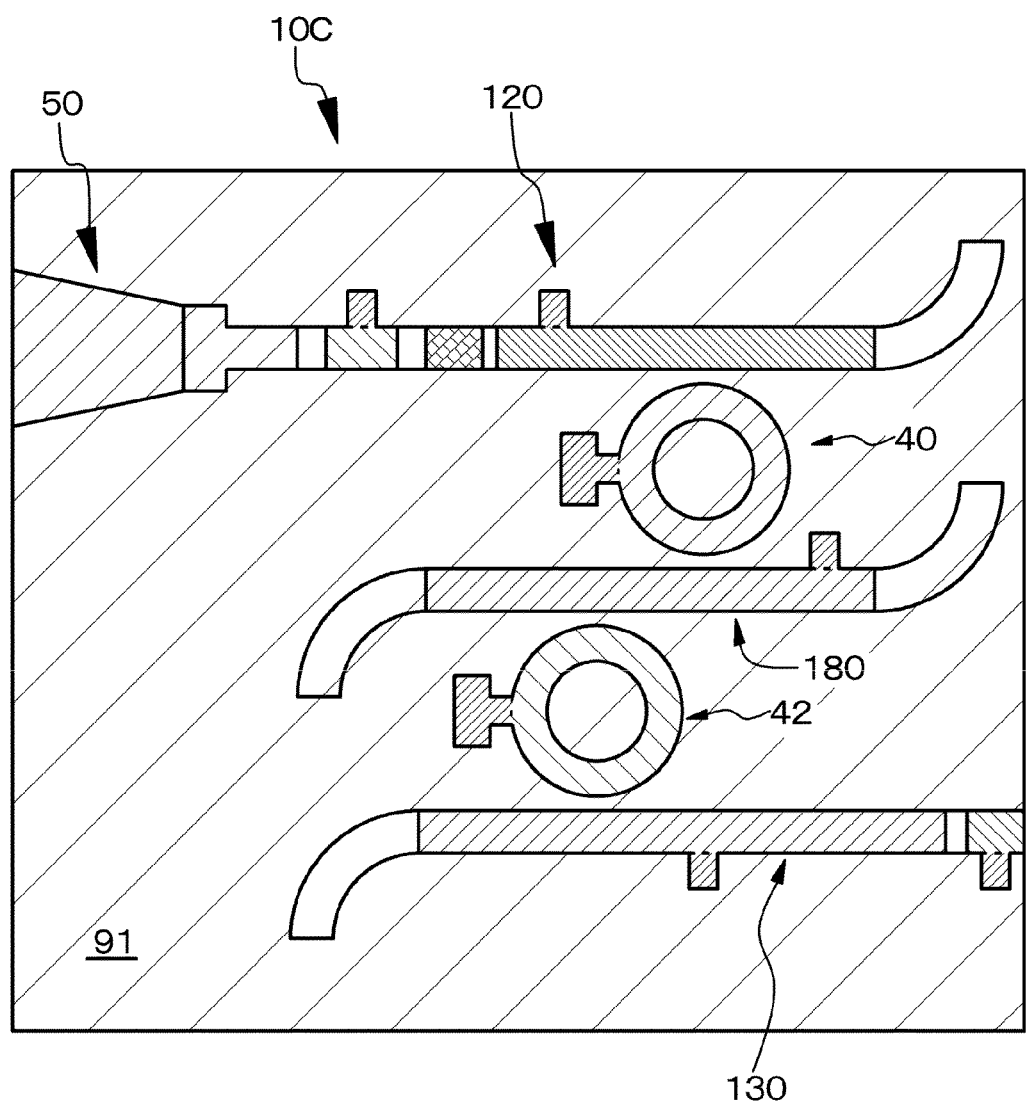
FIG. 4 is a schematic plan view of the monolithic laser device assembly in Example 3.

FIG. 3 and FIG. 4 depict schematic plan views of a monolithic laser device assembly 10C in Example 3. Herein, FIG. 3 is a drawing clearly indicating elements constituting the monolithic laser device assembly 10C in Example 3, and FIG. 4 is a general view of the monolithic laser device assembly 10C in Example 3.

In the laser device assembly in Example 3, a light semi-transmission portion 128 formed on a second end portion 120B of a first gain portion 120, and a light reflection portion 133 disposed on an end face of a third end portion 130A of the second gain portion 130 constitute the resonator, and laser oscillation is performed on this resonator. The light semi-transmission portion 128 disposed on the first gain portion 120 and the pulse selector 60 (specifically, the first end portion 60A of the pulse selector 60) are opposed to each other. A first end portion 120A of the first gain portion 120 includes a bending waveguide 127, and thereby generation of a return light from the first end portion 120A of the first gain portion 120 can be suppressed, and a resonance mode rotating in opposite rotational direction (counterclockwise direction in the example depicted in FIG. 3) can be suppressed. The first gain portion 120 has the same constitution and structure as of the second gain portion 30 explained in Example 1. However, there is a difference in that the first gain portion 120 has the light semi-transmission portion 128 instead of the second light reflection portion (specifically, the second light reflection face) 33. A fourth end portion 130B of the second gain portion 130 includes a bending waveguide 136. The light semi-transmission portion 128 includes a distributed bragg reflector layer. A mode-synchronous semiconductor laser element 130' constituting the second gain portion 130 has substantially the same constitution and structure as of the mode-synchronous semiconductor laser element 20' explained in Example 1.

That is, the second gain portion 130 includes (a) a laminated structure obtained by sequentially laminating the first compound semiconductor layer 230 having the first-type conductivity (specifically, n-type conductivity) and including the GaN-based compound semiconductor, the third compound semiconductor layer (active layer) 240 including the GaN-based compound semiconductor and constituting a light emitting region (gain region) 131 and a saturable absorption region 132, and the second compound semiconductor layer 250 having the second-type conductivity different from the first-type conductivity (specifically, p-type conductivity) and including the GaN-based compound semiconductor, (b) the belt-like second electrode 262 formed on the second compound semiconductor layer 250, and (c) the first electrode 261 electrically connected to the first compound semiconductor layer 230.

Incidentally, the second gain portion 130 including the mode-synchronous semiconductor laser element 130' has the ridge stripe type separate confinement heterostructure (SCH structure).

The second electrode 262 in the second gain portion 130 is equipped with pad portions 134 and 135 for connecting the second electrode 262 to the outside. That is, the pad portion 134 is disposed on the light emitting region (gain region) 131, and the pad portion 135 is disposed on the saturable absorption region 132.

In Example 3, two ring resonators 40 and 42 are disposed. The second electrode of the ring resonator 42 is equipped with the pad portion 43 for connecting the second electrode to the outside. Between the two ring resonators 40 and 42, a third gain portion 180 optically coupled with these ring resonators 40 and 42 is disposed. Bending waveguides 186 and 187 are disposed on one end portion and the other end portion of the third gain portion 180. On the top face of the third gain portion 180, independent second electrodes are disposed, and a pad portion 184 for connecting the second electrode to the outside is disposed. Note that the number of the ring resonators is not limited to two. Also in Example 1 or Example 2, the plurality of ring resonators 40 and 42, and the third gain portion 180 can be disposed.

Between the light semi-transmission portion 128 and the pulse selector 60 (specifically, the first end portion 60A of the pulse selector 60), the laminated structure 90 is left. Also, between the second end portion 60B of the pulse selector 60 and the semiconductor optical amplifier 50, the laminated structure 90 is left. There is a space between the first gain portion 120 and the ring resonator 40, and there are also spaces between the ring resonator 40 and the third gain portion 180, between the third gain portion 180 and the ring resonator 42, and between the ring resonator 42 and the second gain portion 130.

As described hereinbefore, the present disclosure has been explained on the basis of the preferable embodiments, but the present disclosure is not limited to these examples. The constitutions and structural constitutions of the laser device assembly, the mode-synchronous semiconductor laser element, and the semiconductor optical amplifier explained in Examples are merely exemplary, and can be appropriately changed. Although various values have been presented in Examples, the values are also merely exemplary, and naturally the values are changed if the specifications of the mode-synchronous semiconductor laser element and the semiconductor optical amplifier to be used are changed. For example, constitutionally the axis of the mode-synchronous semiconductor laser element or the semiconductor optical amplifier may intersect with the axis of the ridge stripe structure at a predetermined angle, or the planar shape of the ridge stripe structure may be changed to a tapered shape.

Figure 9:
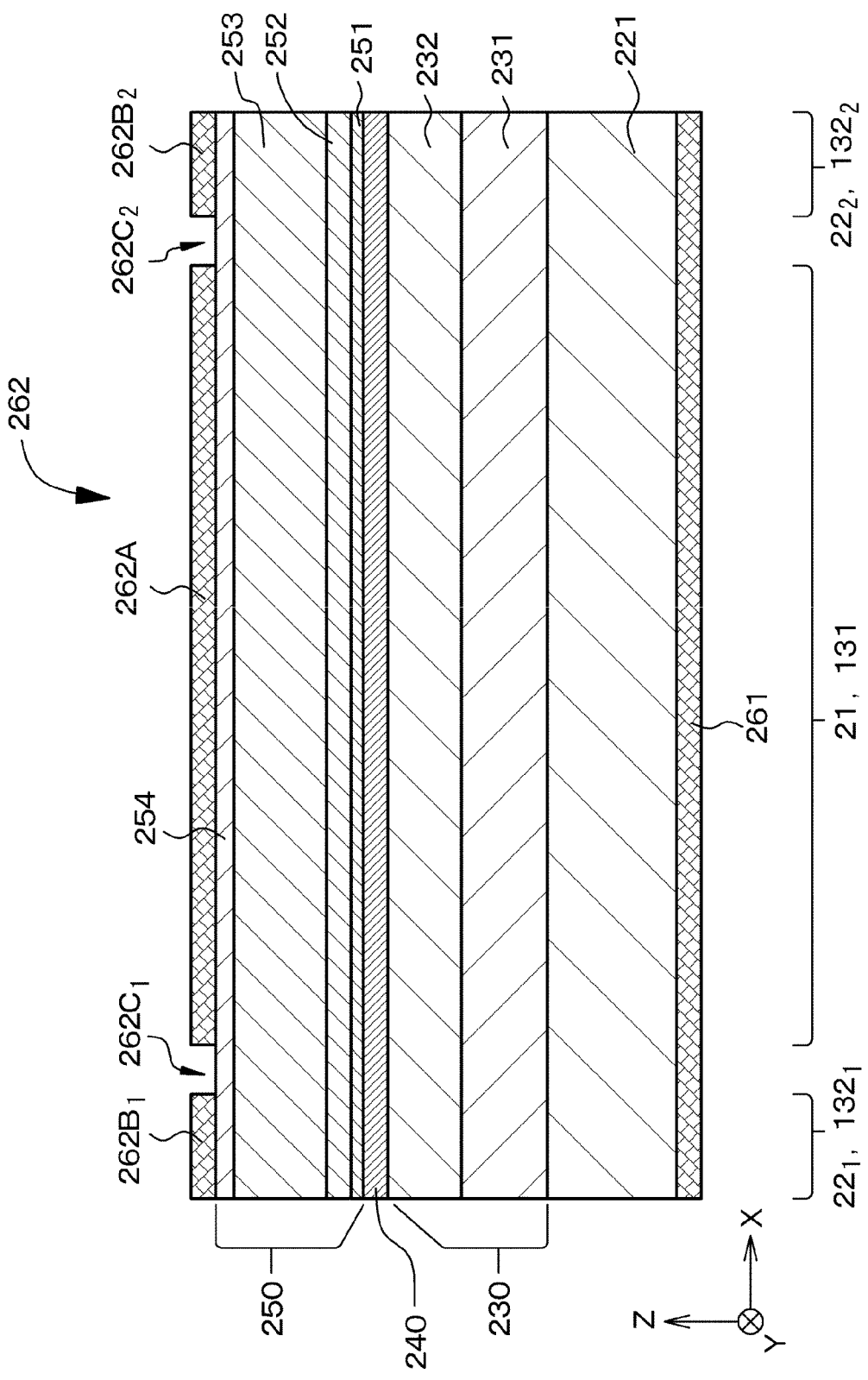
FIG. 9 is a schematic end view of a modification example of the mode-synchronous semiconductor laser element in Example 1, along the extending direction of the resonator.
Figure 10:
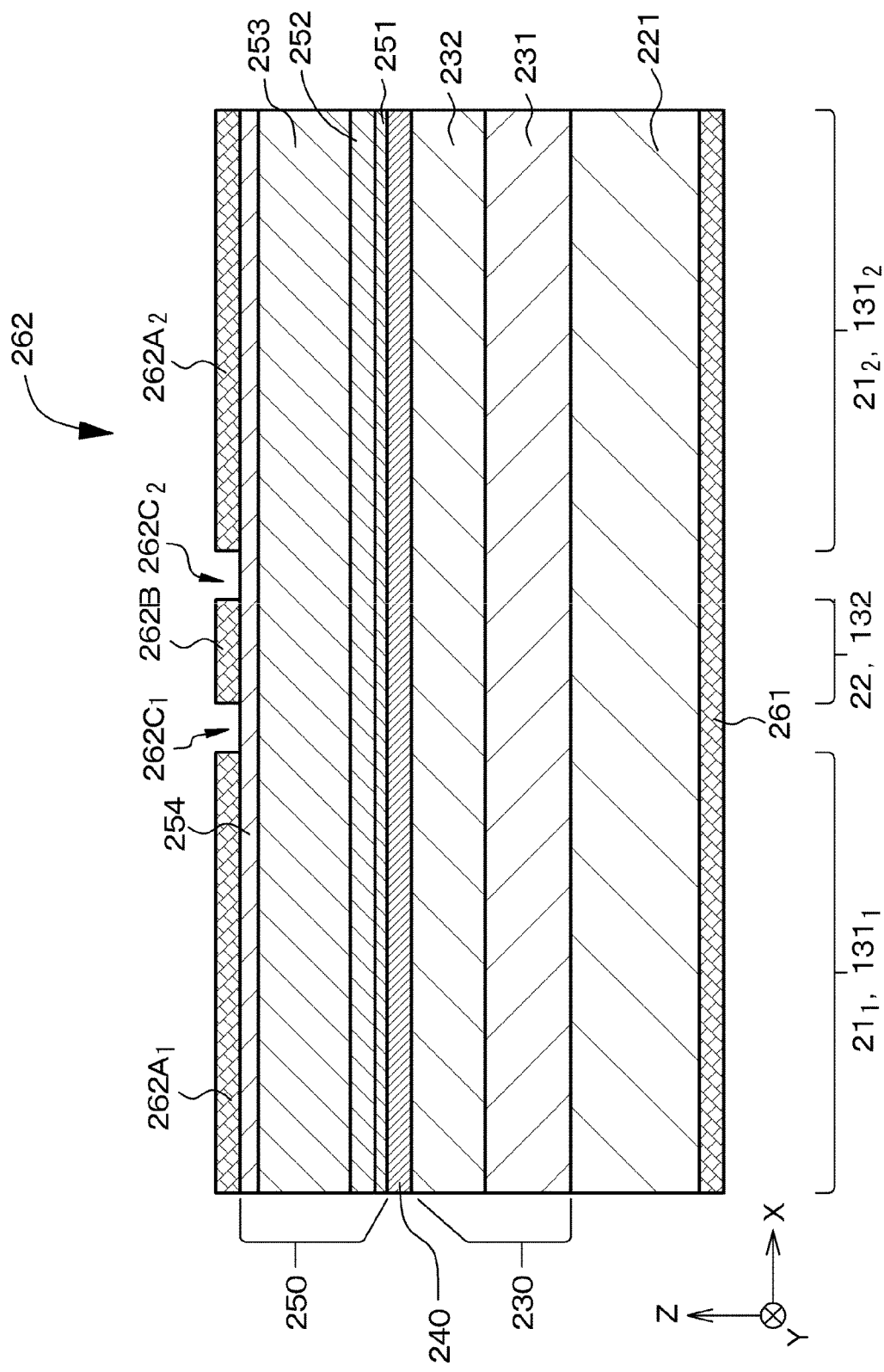
FIG. 10 is a schematic end view of another modification example of the mode-synchronous semiconductor laser element in Example 1, along the extending direction of the resonator.

The numbers of the light emitting regions 21 and 131 and the saturable absorption regions 22 and 132 are not limited to one. FIG. 9 and FIG. 10 depict schematic end views of the mode-synchronous semiconductor laser element equipped with one first portion 262A of the second electrode, and two second portions $262B_1$ and $262B_2$ of the second electrode (multi-section type (multi electrode type) mode-synchronous semiconductor laser element). In the mode-synchronous semiconductor laser element depicted in FIG. 9, one end of the first portion 262A is opposed to one second portion $262B_1$ so as to sandwich one separation groove $262C_1$, and the other end of the first portion 262A is opposed to the other second portion $262B_2$ so as to sandwich the other separation groove $262C_2$. Then, one light emitting region 21 or 131 is sandwiched by two saturable absorption regions $22_1$ and $132_2$. Alternatively, FIG. 10 depicts a schematic end view of the mode-synchronous semiconductor laser element equipped with two first portions $262A_1$ and $262A_2$ of the second electrode, and one second portion 262B of the second electrode. In this mode-synchronous semiconductor laser element, the end portion of the second portion 262B is opposed to one first portion 262A$_1$ so as to sandwich one separation groove 262C$_1$, and the other end of the second portion 262B is opposed to the other first portion 262A$_2$ so as to sandwich the other separation groove 262C$_2$. Then, one saturable absorption region 22 or 132 is sandwiched by two light emitting regions out of 21$_1$, 131$_1$, 21$_2$, and 131$_2$.

Figure 11:
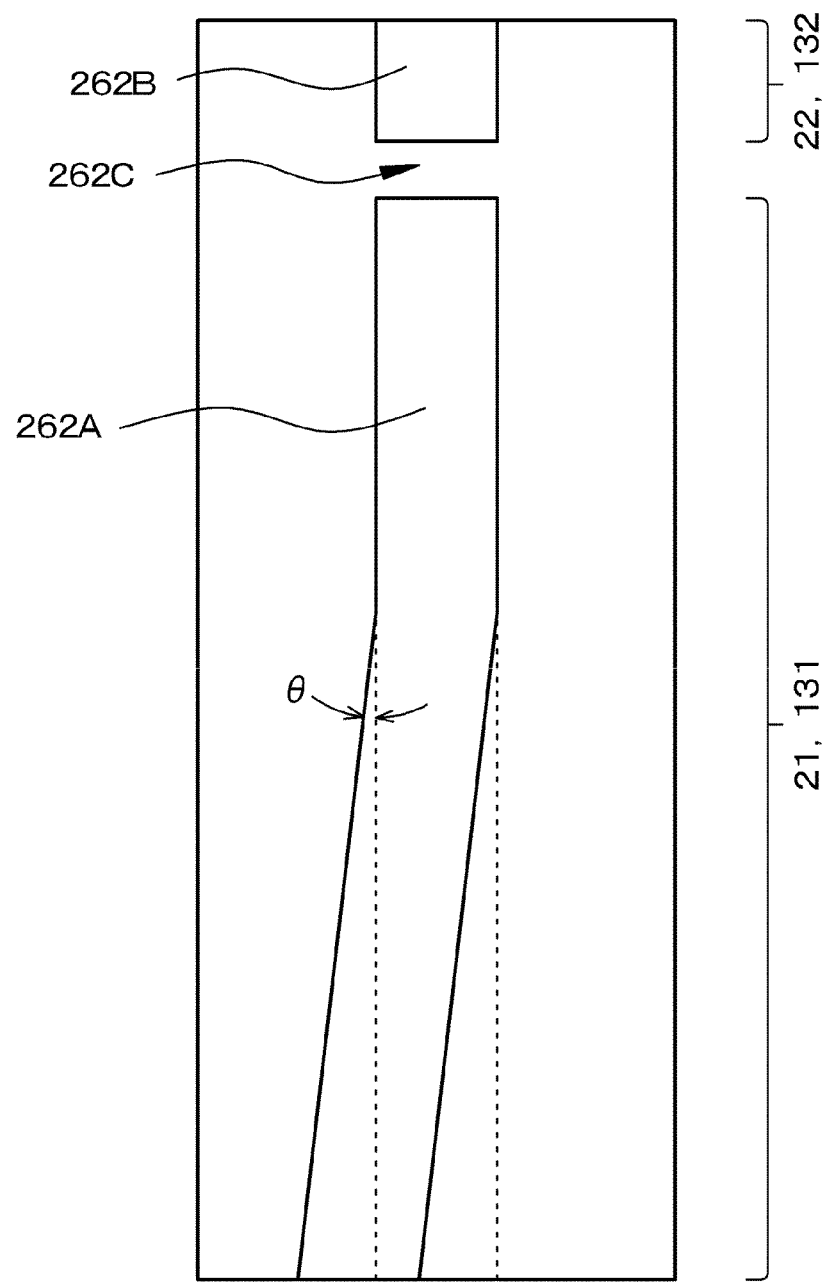
FIG. 11 is a schematic diagram of a ridge stripe structure in a further another modification example of the mode-synchronous semiconductor laser element in Example 1, from an upper view.

The mode-synchronous semiconductor laser element can have a slanting ridge stripe type separate confinement heterostructure with a slanting waveguide. FIG. 11 depicts a schematic diagram of the ridge stripe structure in such a mode-synchronous semiconductor laser element, from an upper view. This mode-synchronous semiconductor laser element has a structure with combined two linear ridge stripe structures, and it is desirable that a value of an angle θ at which the two ridge stripe structures intersect with each other is, e.g., 0<θ≤10 (degree)

preferably,

0<θ≤6 (degree).

In Examples, the mode-synchronous semiconductor laser element or the semiconductor optical amplifier is disposed on a {0001} face as the C face which is the polar face of the n-type GaN substrate, but alternatively may be disposed on a nonpolar face such as an A face as a {11-20} face, an M face as a {1-100} face, and a {1-102} face; or a semipolar face such as a {11-2n} face including a {11-24} face and a {11-22} face, a {10-11} face, and a {10-12} face. Thereby, even if a piezoelectric polarization or a spontaneous polarization occurs in the third compound semiconductor layer (active layer) of the mode-synchronous semiconductor laser element or the semiconductor optical amplifier, no piezoelectric polarization occurs in the thickness direction of the third compound semiconductor layer, but a piezoelectric polarization occurs in a direction substantially perpendicular to the thickness direction of the third compound semiconductor layer, and therefore adverse effects resulting from the piezoelectric polarization or spontaneous polarization can be eliminated. The {11-2n} face means a nonpolar face which forms approximately 40 degrees to the C face. Additionally, in a case that the mode-synchronous semiconductor laser element is disposed on a nonpolar face or a semipolar face, restrictions in the thickness of the well layer (1 to 10 nm) and in the impurity doping concentration on the barrier layer ($2\times10^{18}$ to $1\times10^{20}$ cm$^{-3}$) can be eliminated.

Furthermore, the present disclosure can have the following constitutions.

[A01]
<<Laser Device Assembly>>
A monolithic laser device assembly including:
a first gain portion having a first end portion and a second end portion;
a second gain portion having a third end portion and a fourth end portion;
one or multiple ring resonators;
a semiconductor optical amplifier amplifying a laser light emitted from the first gain portion; and
a pulse selector disposed between the first gain portion and the semiconductor optical amplifier, in which
the ring resonator is optically coupled with the first gain portion and with the second gain portion, and
laser oscillation is performed on either the first gain portion or the second gain portion.

[A02]
The laser device assembly according to [A01], in which
a first light reflection portion disposed on an end face of the first end portion of the first gain portion and a second light reflection portion disposed on an end face of the third end portion of the second gain portion constitute a resonator, and
laser oscillation is performed in the resonator.

[A03]
<<Laser Device Assembly of the First Configuration>>
The laser device assembly according to [A02], in which
a first end portion of the pulse selector and the second end portion of the first gain portion are opposed to each other, and
a second end portion of the pulse selector and the semiconductor optical amplifier are opposed to each other.

[A04]
The laser device assembly according to [A02] or [A03], in which the fourth end portion of the second gain portion includes a bending waveguide.

[A05]
<<Laser Device Assembly of the Second Configuration>>
The laser device assembly according to [A02], in which an optical coupler is disposed between the second end portion of the first gain portion and the pulse selector.

[A06]
The laser device assembly according to [A05], in which one end portion of the optical coupler is opposed to the pulse selector, and
an other end portion of the optical coupler includes the bending waveguide.

[A07]
The laser device assembly according to [A05] or [A06], in which the second end portion of the first gain portion includes the bending waveguide.

[A08]
The laser device assembly according to any one of [A05] to [A07], in which the fourth end portion of the second gain portion includes the bending waveguide.

[A09]
<<Laser Device Assembly of the Third Configuration>>
The laser device assembly according to [A01], in which
a light semi-transmission portion disposed on the second end portion of the first gain portion, and the light reflection portion disposed on the end face of the third end portion of the second gain portion constitute the resonator, and
laser oscillation is performed on the resonator.

[A10]
The laser device assembly according to [A09], in which the light semi-transmission portion disposed on the first gain portion and the pulse selector are opposed to each other.

[A11]
The laser device assembly according to [A09] or [A10], in which the first end portion of the first gain portion includes the bending waveguide.

[A12]
The laser device assembly according to any one of [A09] to [A11], in which the fourth end portion of the second gain portion includes the bending waveguide.

[A13]
The laser device assembly according to any one of [A02] to [A08], in which the first gain portion includes a mode-synchronous semiconductor laser element.

[A14]
The laser device assembly according to any one of [A09] to [A12], in which the second gain portion includes the mode-synchronous semiconductor laser element.

[A15]

The laser device assembly according to any one of [A01] to [A14], in which the pulse selector has a structure that a positive bias and a reverse bias are applied, when the positive bias is applied to the pulse selector, the laser light emitted from the first gain portion enters the semiconductor optical amplifier, and when the reverse bias is applied to the pulse selector, the laser light emitted from the first gain portion is prevented from entering the semiconductor optical amplifier by the pulse selector.

[A16]

The laser device assembly according to [A15], in which the pulse selector make the laser light passing through the ring resonator enter the semiconductor optical amplifier.

[A17]

The laser device assembly according to any one of [A01] to [A16], in which the first gain portion, the second gain portion, the ring resonator, the semiconductor optical amplifier, and the pulse selector include laminated structures of compound semiconductor layers having the same structure.

[A18]

The laser device assembly according to [A17], in which the compound semiconductor layers include a nitride-based compound semiconductor.

[A19]

The laser device assembly according to [A17] or [A18], in which the first gain portion, the second gain portion, the ring resonator, the semiconductor optical amplifier, and the pulse selector are disposed on a second face of a substrate, a first electrode is formed on a first face of the substrate, and independent second electrodes are disposed on at least a part of each top face of the first gain portion, the second gain portion, the ring resonator, the semiconductor optical amplifier, and the pulse selector.

[A20]

The laser device assembly according to any one of [A01] to [A19], in which the first gain portion, the second gain portion, the ring resonator, the semiconductor optical amplifier, and the pulse selector have a ridge structure.

REFERENCE SIGNS LIST 10A, 10B, 10C . . . Monolithic laser device assembly, 20, 120 . . . First gain portion, 20', 130' . . . Mode-synchronous semiconductor laser element, 20A, 120A . . . First end portion of first gain portion, 20B, 120B . . . Second end portion of first gain portion, 20a . . . End face on first end portion of first gain portion, 21, 131 . . . Light emitting region (gain region), 22, 132 . . . Saturable absorption region, 23, 133 . . . First light reflection portion (first light reflection face), 24, 25, 34, 35, 41, 43, 61, 71, 84, 134, 135 . . . Pad portion, 26, 27, 36, 76, 86, 87, 127, 136 . . . Bending waveguide, 128 . . . Light semi-transmission portion, 30, 130 . . . Second gain portion, 30A, 130A . . . Third end portion of second gain portion, 30a, 130B . . . End face on third end portion of second gain portion, 30B . . . Fourth other end portion of second gain portion, 33 . . . Second light reflection portion (second light reflection face) or light reflection portion (light reflection face), 40, 42 . . . Ring resonator, 50 . . . Semiconductor optical amplifier, 60 . . . pulse selector, 60A . . . First end portion of pulse selector, 60B . . . Second end portion of pulse selector, 70 . . . Optical coupler, 80 . . . Third gain portion, 90 . . . Laminated structure, 91 . . . Region of laminated structure other than ridge structure, 221 . . . Substrate, 221A . . . First face of substrate, 221B . . . Second face of substrate, 230 . . . First compound semiconductor layer, 231 . . . n-type AlGaN clad layer, 232 . . . n-type GaN clad layer, 240 . . . Third compound semiconductor layer (active layer), 250 . . . Second compound semiconductor layer, 251 . . . Non-doped GaInN light guide layer, 252 . . . p-type AlGaN electron barrier layer (Mg-doped), 253 . . . p-type GaN (Mg-doped)/AlGaN superlattice clad layer, 254 . . . p-type GaN contact layer (Mg-doped), 255 . . . Ridge stripe structure, 261 . . . First electrode, 262 . . . Second electrode, 262A . . . First portion of second electrode, 262B . . . Second portion of second electrode, 262C . . . Separation groove

The invention claimed is:

1. A monolithic laser device assembly, comprising:
a first gain portion having a first end portion and a second end portion, wherein the first gain portion is configured to emit a laser light;
a second gain portion having a third end portion and a fourth end portion;
at least one ring resonator;
a semiconductor optical amplifier;
a pulse selector between the first gain portion and the semiconductor optical amplifier, wherein the semiconductor optical amplifier is configured to:
receive, through the pulse selector, the laser light emitted from the first gain portion; and
amplify the received laser light, wherein
the at least one ring resonator is optically coupled with the first gain portion and with the second gain portion, and
laser oscillation is performed on either the first gain portion or the second gain portion; and
an optical coupler between the second end portion of the first gain portion and the pulse selector, wherein the optical coupler is optically coupled with the second end portion of the first gain portion.

2. The monolithic laser device assembly according to claim 1, wherein
a first light reflection portion on an end face of the first end portion of the first gain portion and a second light reflection portion on an end face of the third end portion of the second gain portion constitute a resonator, and
the laser oscillation is performed in the resonator.

3. The monolithic laser device assembly according to claim 2, wherein
a first end portion of the pulse selector is opposite to the second end portion of the first gain portion, and
a second end portion of the pulse selector is opposite to the semiconductor optical amplifier.

4. The monolithic laser device assembly according to claim 2, wherein the fourth end portion of the second gain portion includes a bending waveguide.

5. The monolithic laser device assembly according to claim 1, wherein
a first end portion of the optical coupler is opposed to the pulse selector, and
a second end portion of the optical coupler includes a bending waveguide.

6. The monolithic laser device assembly according to claim 1, wherein the second end portion of the first gain portion includes a bending waveguide.

7. The monolithic laser device assembly according to claim 1, wherein the fourth end portion of the second gain portion includes a bending waveguide.

8. The monolithic laser device assembly according to claim 1, wherein
a light semi-transmission portion on the second end portion of the first gain portion,
a light reflection portion on an end face of the third end portion of the second gain portion constitutes a resonator, and
the laser oscillation is performed on the resonator.

9. The monolithic laser device assembly according to claim 8, wherein the light semi-transmission portion is opposite to the pulse selector.

10. The monolithic laser device assembly according to claim 8, wherein the first end portion of the first gain portion includes a bending waveguide.

11. The monolithic laser device assembly according to claim 8, wherein the fourth end portion of the second gain portion includes a bending waveguide.

12. The monolithic laser device assembly according to claim 2, wherein the first gain portion includes a mode-synchronous semiconductor laser element.

13. The monolithic laser device assembly according to claim 8, wherein the second gain portion includes a mode-synchronous semiconductor laser element.

14. The monolithic laser device assembly according to claim 1, wherein the pulse selector has a structure that,
based on an application of a positive bias to the pulse selector, the laser light emitted from the first gain portion enters the semiconductor optical amplifier, and
based on an application of a reverse bias to the pulse selector, the laser light emitted from the first gain portion is prevented to enter the semiconductor optical amplifier by the pulse selector.

15. The monolithic laser device assembly according to claim 14, wherein the pulse selector is configured to direct the laser light that passes through the ring resonator to enter the semiconductor optical amplifier.

16. The monolithic laser device assembly according to claim 1, wherein
each of the first gain portion, the second gain portion, the at least one ring resonator, the semiconductor optical amplifier, and the pulse selector includes laminated structures of compound semiconductor layers having a same structure, and
each of the laminated structures of the compound semiconductor layers has a same structure.

17. The monolithic laser device assembly according to claim 16, wherein the compound semiconductor layers include a nitride-based compound semiconductor.

18. The monolithic laser device assembly according to claim 16, wherein
the first gain portion, the second gain portion, the at least one ring resonator, the semiconductor optical amplifier, and the pulse selector are on a second face of a substrate,
a first electrode is on a first face of the substrate, and
a plurality of independent second electrodes are on at least a part of each of a top face of the first gain portion, a top face of the second gain portion, a top face of the at least one ring resonator, a top face of the semiconductor optical amplifier, and a top face of the pulse selector.

19. The monolithic laser device assembly according to claim 1, wherein the first gain portion, the second gain portion, the at least one ring resonator, the semiconductor optical amplifier, and the pulse selector have a ridge structure.

20. The monolithic laser device assembly according to claim 1, further comprising:
a first laminated structure between a first end portion of the pulse selector and the second end portion of the first gain portion; and
a second laminated structure between the second end portion of the pulse selector and the semiconductor optical amplifier.

\* \* \* \* \*